(12) United States Patent
Fischer et al.

(10) Patent No.: US 7,443,896 B2
(45) Date of Patent: Oct. 28, 2008

(54) OPTICAL MIDPOINT POWER CONTROL AND EXTINCTION RATIO CONTROL OF A SEMICONDUCTOR LASER

(75) Inventors: Jonathan H. Fischer, Longmont, CO (US); James P. Howley, Broomfield, CO (US)

(73) Assignee: Agere Systems, Inc., Allentown, PA (US)

( * ) Notice: Subject to any disclaimer, the term of this patent is extended or adjusted under 35 U.S.C. 154(b) by 663 days.

(21) Appl. No.: 10/616,334

(22) Filed: Jul. 9, 2003

(65) Prior Publication Data

US 2005/0008050 A1    Jan. 13, 2005

(51) Int. Cl.
*H01S 3/00* (2006.01)
(52) U.S. Cl. ............... 372/38.02; 372/38.1; 372/38.07; 372/38.09; 372/29.02; 372/29.021
(58) Field of Classification Search ............... 372/38.1, 372/38.02, 38.07, 38.09, 29.02, 29.021
See application file for complete search history.

(56) References Cited

U.S. PATENT DOCUMENTS 5,812,572 A * 9/1998 King et al. ............... 372/38.04
6,891,866 B2 * 5/2005 Robinson et al. ....... 372/29.015
6,993,459 B2 * 1/2006 Carrick ....................... 702/189

* cited by examiner

*Primary Examiner*—Minsun Harvey
*Assistant Examiner*—Tod T Van Roy

(57) ABSTRACT

The present invention provides a method and apparatus, such as an integrated circuit, to control the optical midpoint power level and the extinction ratio of a semiconductor laser and maintain the optical midpoint power level and the extinction ratio substantially constant at corresponding predetermined levels. Apparatus embodiments include a semiconductor laser, a modulator, a photodetector, an optical midpoint controller, and an extinction ratio controller. The semiconductor laser is capable of transmitting an optical signal in response to a modulation current. The modulator is capable of providing the modulation current to the semiconductor laser, with the modulation current corresponding to an input data signal. The photodetector, which is optically coupled to the semiconductor laser, is capable of converting the optical signal into a photodetector current. In response to the photodetector current, the optical midpoint controller is capable of adjusting the forward bias current of the semiconductor laser, and the extinction ratio controller is capable of adjusting the modulation current provided by the modulator to the semiconductor laser, to respectively generate the optical signal having substantially a predetermined optical midpoint power level and a predetermined extinction ratio.

30 Claims, 6 Drawing Sheets

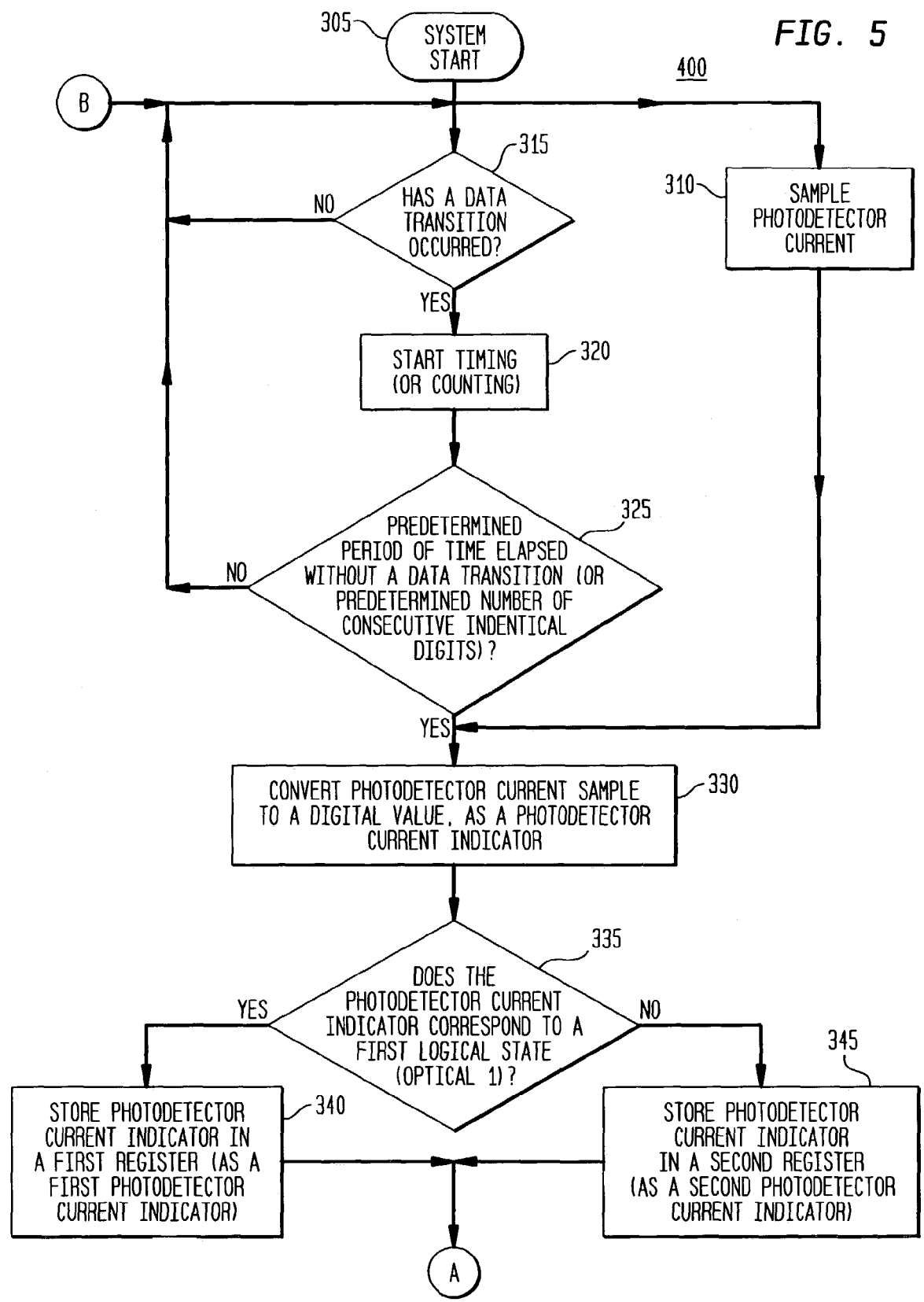

OPTICAL MIDPOINT POWER CONTROL AND EXTINCTION RATIO CONTROL OF A SEMICONDUCTOR LASER

CROSS-REFERENCE TO A RELATED APPLICATION

This application is related to an application of James P. Howley, U.S. patent application Ser. No. 10/616,334, entitled "Extinction Ration Control of a Semiconductor Laser", filed concurrently herewith and subsequently issued on Mar. 1, 2005 as U.S. Pat. No. 6,862,379, commonly assigned to Agere Systems, Inc., and incorporated by reference herein, with priority claimed for all commonly disclosed subject matter (the "related application").

FIELD OF THE INVENTION

The present invention relates, in general, to semiconductor laser systems and, more particularly, to an apparatus and method for controlling a midpoint power level of a semiconductor laser.

BACKGROUND OF THE INVENTION

Semiconductor lasers, such as laser diodes, produce coherent light waves at a wide variety of wavelengths of the electromagnetic spectrum, and are ideal for many applications, such as optical fiber communication and network systems, laser printers, bar code scanners, compact disc players, etc. Laser diodes and other laser semiconductors generally include an active layer or region, using materials such as, for example, gallium arsenide, gallium indium arsenide, gallium nitride, variations of these materials including zinc oxide and/or phosphorous, or another direct bandgap semiconductor material. Because laser diodes also can be directly modulated at high frequencies (e.g., at several GHz), through modulation of their "drive current", laser diodes are often used in high speed communication and other networking applications, such as for data transmission, voice communication, multimedia applications, and so on.

Laser performance, including the optical output power provided by the laser, however, varies due to a number of factors including, for example, the laser temperature, the age of the semiconductor laser, and process variations in semiconductor laser fabrication. Such performance variations include a change in the laser transfer function, namely, a change in laser output power ("L") for a given laser diode current ("I") (forward bias current). These changes in output power and forward bias current characteristics may be represented graphically as: (1) a shift in a graphical slope of the transfer function (laser output power versus forward bias current (L-I slope)) characterizing the semiconductor laser; and (2) a shift in the laser threshold current (i.e., the level of forward bias current at which the semiconductor laser first demonstrates coherent radiation).

As a consequence, such laser performance variations also cause undesirable variations in an "extinction ratio", which is defined as the ratio of the optical output power resulting from transmission by the semiconductor laser of a signal representing a data logical 1 (or high), at a first (or comparatively higher) power level, to the optical output power resulting from transmission by the semiconductor laser of a signal representing a data logical 0 (or low), at a second (or comparatively lower) power level (i.e., the ratio of the first power level for a logical one to the second power level for a logical zero). Laser performance variations which diminish the extinction ratio, as a consequence, cause undesirable variations in the signal-to-noise ratio (SNR) of the semiconductor laser. For example, as the L-I slope characterizing the semiconductor laser decreases for given forward bias and modulation currents, the difference between optical 1 (high) signal power and the optical 0 (low) signal power decreases, degrading the signal-to-noise ratio.

Providing an appropriate level of forward bias current, to produce correspondingly appropriate laser output power levels, is also required for many laser applications, such as data transmission applications, both initially when a laser system is installed or started, and also when output power levels may change over time for a given forward bias current. In the prior art, such output power control has focused on maintaining average laser output power levels at a certain level by adjusting the forward bias current until the desired average power level is reached. See C. Olgaard, "A Laser Control Chip Combining a Power Regulator and a 622-Mbit/s Modulator," IEEE Journal of Solid-State Circuits, Vol. 29, No. 8, August 1994, pp. 947-951. Average output power levels, however, vary with the duty cycle of the laser, i.e., vary with the data being transmitted: when comparatively more optical 1 bits (high power) are transmitted, the average power increases, and when comparatively more optical 0 bits (low power) are transmitted, the average power decreases.

To avoid significant average power level fluctuations as a function of duty cycle, such prior art control systems require power averaging over a considerably long period of time. The averaging period is selected to have a sufficient duration such that the average power over that period will be approximately independent of the transmitted data. Such a long averaging period to determine and achieve appropriate output power levels, however, results in considerable delay and slow response on system start up. More particularly, on system start up, such systems are slow to reach appropriate power levels to begin their selected applications, such as for data transmission.

Also to reduce the dependency of average power levels on the duty cycle, other prior art power control systems have focused on setting the actual power levels of either the optical 1 power level or the optical 0 power level. See P. W. Shumate, Jr., F. S. Chen, and P. W. Dorman, "GaAlAs Laser Transmitter for Lightwave Transmission Systems," Bell System Technical Journal, Vol. 57, No. 6, July-August 1978, pp. 1823-1836; and F. S. Chen "Simultaneous Feedback Control of Bias and Modulation Currents for Injection Lasers," Electronic Letters, $3^{rd}$ January 1980, Vol. 16, No. 1, pp. 7-8. These references utilize an analog current subtraction technique to remove the extra current from a photodetector feedback current signal when transmitting an optical 1 compared to an optical 0 to reduce the data pattern dependence on setting the optical 0 and 1 levels. This technique requires each laser driver (the laser diode and photo detector unit) to be individually trimmed to cancel the data dependence; that is, the current levels must be manually adjusted for each and every fabricated laser drive unit. In addition, this data dependence cancellation technique does not compensate for device aging.

In addition to maintaining appropriate or optimal forward bias current levels, in light of laser performance variations, maintaining appropriate signal-to-noise ratios, may be achieved by maintaining a substantially or significantly constant extinction ratio. Prior art attempts to maintain such a constant extinction ratio include use of an open loop adjustment to a laser diode's operating points, based on the laser die temperature and a look-up table. Unfortunately, such an open loop system provided no guarantee that the corresponding adjustments to the operating points were yielding the desired effect of maintaining a constant extinction ratio, and did not account for the effects of laser aging. In addition, in the open loop system, accurate characterization of the laser was required to program the look-up table, process variations were unaccounted for unless each system was programmed independently, and the laser die temperature may not accurately represent the semiconductor laser's operating temperature.

Another prior art attempt to maintain a constant extinction ratio superimposed a low frequency modulation to the transmit power level associated with an optical 1, and then using resulting data, calculated the laser diode's L-I slope to approximate the extinction ratio and provide some form of correction. See Bosch et al. U.S. Pat. No. 5,373,387, "Method for Controlling the Amplitude of an Optical Signal", issued Dec. 13, 1994; and Bosch et al. U.S. Pat. No. 5,448,629, "Amplitude Detection Scheme for Optical Transmitter Control", issued Sep. 5, 1995. Unfortunately, this extinction ratio determination method was inaccurate, as correction to the extinction ratio was sensitive to non-linearity (curvature) in the semiconductor laser's transfer function characteristics, and the method did not directly determine the actual extinction ratio.

As a consequence, a need remains for an apparatus and method to control the power levels and the extinction ratio of a semiconductor laser.

SUMMARY OF THE INVENTION

The present invention provides an apparatus and method for a semiconductor laser to generate an optical signal having a substantially constant, predetermined optical midpoint power level and predetermined extinction ratio. The various apparatus embodiments, such as circuit embodiments, include a semiconductor laser, a modulator, a photodetector, an optical midpoint controller, and an extinction ratio controller.

In the various embodiments, the semiconductor laser, such as a laser diode, is capable of transmitting an optical signal having a first optical power level in response to a first modulation current level and having a second optical power level in response to a second modulation current level, with the first optical power level being greater than the second optical power level. The modulator, which is coupled to the semiconductor laser, is capable of providing the first modulation current level to the semiconductor laser when the input data signal has a first logical state, such as a logical one, and providing the second modulation current level to the semiconductor laser when the input data signal has a second logical state, such as a logical zero, with the first modulation current level being greater than the second modulation current level.

The photodetector is optically coupled to the semiconductor laser, and is capable of generating a first photodetector current level in response to the first optical power level and a second photodetector current level in response to the second optical power level. The optical midpoint controller, consisting of a sampler and a forward bias current controller, is coupled to the photodetector and to the semiconductor laser. The sampler portion of the optical midpoint controller is capable of sampling the first photodetector current level to form a first photodetector current indicator and sampling the second photodetector current level to form a second photodetector current indicator. The forward bias current controller portion of the optical midpoint controller is capable of determining a measured optical midpoint power level as an arithmetic mean of the first photodetector current indicator and the second photodetector current indicator; determining a variance between the measured optical midpoint power level and a predetermined optical midpoint power level and, based on the variance, forming an optical midpoint error signal; and in response to the optical midpoint error signal, is further capable of adjusting the forward bias current of the semiconductor laser to generate the optical signal having substantially the predetermined optical midpoint power level.

Depending on the bandwidth (or responsiveness) of the photodetector or other component (i.e., how quickly the photodetector settles to an accurate current level in response to the optical signal), the sampler may also include a timer capable of enabling the sampling of the first photodetector current level when the input data signal has a predetermined number of consecutive bits having the first logical state and enabling the sampling of the second photodetector current level when the input data signal has a predetermined number of consecutive bits having the second logical state. Alternatively, the timer is capable of enabling the sampling of the first photodetector current level when the input data signal has the first logical state for a predetermined period of time and enabling the sampling of the second photodetector current level when the input data signal has the second logical state for the predetermined period of time.

In various embodiments, the sampler is further capable of sampling the first photodetector current level to form a plurality of first photodetector current indicators and sampling the second photodetector current level to form a plurality of second photodetector current indicators. For this embodiment, the forward bias current controller is further capable of determining the measured optical midpoint power level as an overall mean of a first arithmetic mean of the plurality of first photodetector current indicators and a second arithmetic mean of the plurality of second photodetector current indicators, and determining a variance between the measured optical midpoint power level and the predetermined optical midpoint power level, and based on the variance, forming the optical midpoint error signal.

In response to the optical midpoint error signal in various forms, the forward bias current may be controlled in several ways, such as by the forward bias current controller providing a forward bias current adjustment signal to a variable current source (or directly to the semiconductor laser) to vary the forward bias current levels, or by the forward bias current controller directly varying the forward bias current levels of the semiconductor laser. In one embodiment, the forward bias current controller is further capable of integrating the optical midpoint error signal with a plurality of previous optical midpoint error signals to form an integrated optical midpoint error signal, and is further capable of adjusting the forward bias current by providing a selected current path for the semiconductor laser, of a plurality of varied or variable current paths, with the selected current path corresponding to the integrated optical midpoint error signal. In another embodiment, the forward bias current controller is capable of providing, in response to the optical midpoint error signal or an integrated optical midpoint error signal, a forward bias current adjustment signal to a variable current source, and in response to the forward bias current adjustment signal, the variable current source is capable of adjusting the forward bias current for the semiconductor laser to generate the optical signal having substantially the predetermined optical midpoint power level.

The extinction ratio controller, sharing the sampler and further including a modulation current controller, is coupled to the photodetector and to the modulator. The modulation current controller portion of the extinction ratio controller is capable of determining a measured extinction ratio as a ratio of the first photodetector current indicator to the second photodetector current indicator; determining a variance between the measured extinction ratio and a predetermined extinction ratio and, based on the variance, forming an extinction ratio error signal; and in response to the extinction ratio error signal, is further capable of adjusting the modulation current provided by the modulator to the semiconductor laser to generate the optical signal substantially having the predetermined extinction ratio.

In various embodiments, when the sampler has provided a plurality of first photodetector current indicators and a plurality of second photodetector current indicators, the modulation current controller is further capable of determining the measured extinction ratio as a ratio of a first arithmetic mean of the plurality of first photodetector current indicators to a second arithmetic mean of the plurality of second photodetector current indicators, and determining a variance between the measured extinction ratio and the predetermined extinction ratio, and based on the variance, forming the extinction ratio error signal.

In response to the extinction ratio error signal in various forms, the modulation current may be controlled in several ways, such as by the modulation current controller providing a modulation adjustment signal to the modulator for the modulator to vary its current levels, or by the modulation current controller directly varying the modulation current levels of the modulator. In one embodiment, the modulation current controller is further capable of integrating the extinction ratio error signal with a plurality of previous extinction ratio error signals to form an integrated extinction ratio error signal, and is further capable of adjusting the modulation current by providing a selected current path for the modulator, of a plurality of varied or variable current paths, with the selected current path corresponding to the integrated extinction ratio error signal. In another embodiment, the modulation current controller is capable of providing, in response to the extinction ratio error signal or an integrated extinction ratio error signal, a modulation (current) adjustment signal to the modulator, and in response to the modulation current adjustment signal, the modulator is capable of adjusting the first modulation current level and the second modulation current level for the semiconductor laser to generate the optical signal having substantially the predetermined extinction ratio.

Numerous other advantages and features of the present invention will become readily apparent from the following detailed description of the invention and the embodiments thereof, from the claims and from the accompanying drawings.

BRIEF DESCRIPTION OF THE DRAWINGS

FIGS. 5 and 5A, individually and collectively referred to as FIG. 5, are flow diagrams of an exemplary method embodiment in accordance with the present invention.

DETAILED DESCRIPTION OF THE INVENTION

Figure 1:
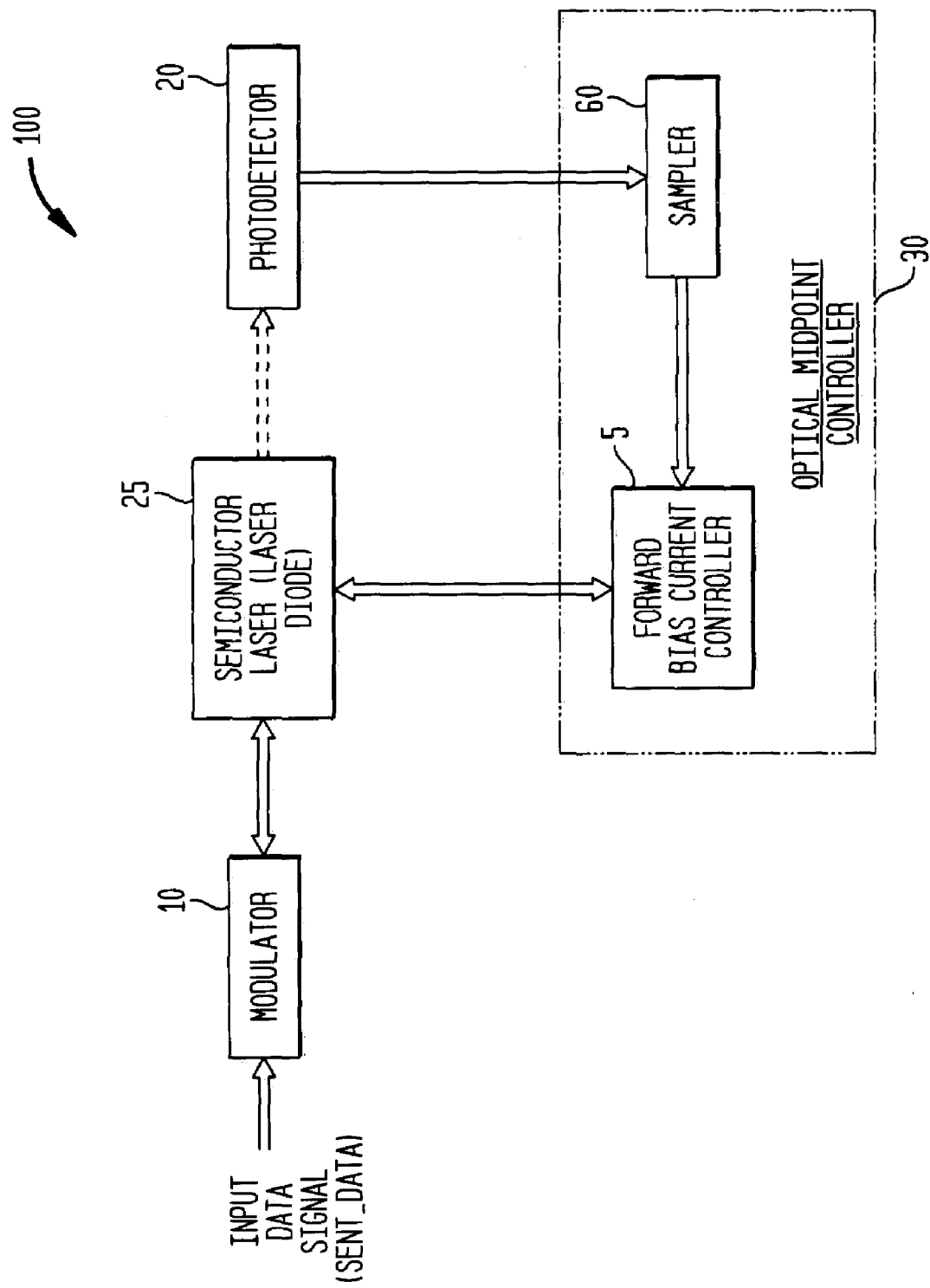
FIG. 1 is a block diagram of an exemplary first apparatus embodiment in accordance with the present invention.

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, the present invention provides an apparatus and method for controlling the midpoint power level and the extinction ratio of a semiconductor laser. As discussed in greater detail below, the present invention provides for determining and adjusting a forward bias current of a laser diode to maintain an optical output signal having a substantially constant midpoint power level, and for determining and adjusting a modulation current of a laser diode to generate an optical output signal having a substantially constant, predetermined extinction ratio. As a consequence, the various embodiments of the present invention provide significant compensation for the changing characteristics of semiconductor lasers, maintaining the quality of the laser optical output at predetermined or user selected levels for both output power and the extinction ratio.

FIG. 1 is a block diagram of an exemplary first apparatus embodiment 100 in accordance with the present invention. The exemplary apparatus 100 may be embodied as an integrated circuit, or as a portion of an integrated circuit having other, additional components. Typically, the apparatus 100 is embodied with a semiconductor laser and photodetector as discrete components, and the remainder of the apparatus as an integrated circuit, with all such discrete or integrated embodiments considered equivalent and within the scope of the present invention.

Referring to FIG. 1, the apparatus 100 includes a semiconductor laser such as a laser diode 25, a modulator 10, a photodetector 20, and an optical midpoint controller 30. The optical midpoint controller 30 includes a sampler 60 and a forward bias current controller 5. The modulator 10 provides a modulation current to the laser diode 25, in response to an input data signal (illustrated as "SENT_DATA"), providing a first level of modulation current (i.e., a first modulation current or first modulation current level) when the input data signal has a first logical state, and a second level of modulation current (i.e., a second modulation current or second modulation current level) when the input data signal has a second logical state. These first and second logical states of the input signal, equivalently, may be corresponding voltage levels, and reference to either a logical state or voltage level shall mean and include reference to the other.

With a forward bias current provided by the forward bias current controller 5 (discussed in greater detail below), and in response to these levels of modulation current from the modulator 10, the laser diode 25 is operative to transmit an optical signal corresponding to the input data signal (with the transmitted or output optical signal representing first and second logical states referred to as "optical 1's" and "optical 0's", respectively). As mentioned above, when the input data signal is a logical one or high, the optical output signal has a first optical power level, and when the input data signal is a logical zero or low, the optical output signal has a second optical power level. While the first optical power level is generally greater than the second optical power level, alternative logical assignments of data to power levels may be utilized within the scope of the present invention. As discussed in greater detail below with reference to FIG. 2, the amount or level of both first and second modulation currents provided by the modulator 10 to the laser diode 25, for the first optical power level and the second optical power level, respectively, is determined by an extinction ratio controller 15.

In accordance with the present invention, the optical midpoint controller 30, through the forward bias current controller 5, will adjust the forward bias current provided to the laser diode 25 to achieve and maintain substantially a predetermined optical midpoint power level. As used herein, the optical midpoint power level is an arithmetic average (or mean) of the optical 1 (high or "H") power level and the optical zero (low or "L") power level (i.e., (first optical power level+ second optical power level)/2 or (H+L)/2). For example, and as discussed in greater detail below, a predetermined (or user selected) optical midpoint power level is the arithmetic mean of the predetermined or user selected first optical power level and the predetermined (or user selected) second optical power level. Also for example, a measured optical midpoint power level is an arithmetic mean of a measured first optical power level and a measured second optical power level, as output from the semiconductor laser and detected by the photodetector (as corresponding photodetector current levels). In addition, the measured optical midpoint power level may also be determined as an overall or combined arithmetic mean of a first mean value of a plurality of samples of the measured first optical power level and a second mean value of a plurality of samples of the measured second optical power level, also as output from the semiconductor laser and detected by the photodetector (as corresponding photodetector current levels). As discussed in greater detail below, as these measured values are detected as photodetector current levels, the measured optical midpoint power level may be correspondingly scaled to reflect the corresponding optical output power levels.

The optical midpoint power level will correspond to the average output power level generally only when the transmitted data contains a precisely equal number of optical 1's and optical 0's. While the optical midpoint power level will remain stable independently of the duty cycle, the average power level will increase when comparatively more optical 1's are transmitted, and the average power level will decrease when comparatively more optical 0's are transmitted. As a consequence, the midpoint power level should not be confused with the average power level.

As discussed in greater detail below, as the laser diode 25 operates and transmits data, the optical midpoint controller 30 will measure the optical midpoint power level being produced, as a measured optical midpoint power level, and will compare the measured optical midpoint power level to a predetermined, user selected optical midpoint power level. When the measured optical midpoint power level varies from the predetermined optical midpoint power level, the optical midpoint controller 30 (through the forward bias current controller 5) will correspondingly adjust and maintain the forward bias current level such that the measured optical midpoint power level will be or become substantially equal to the predetermined optical midpoint power level.

A semiconductor laser, such as laser diode 25, emits coherent radiation from both a forward facet and a rear facet of the active layer. While not separately illustrated, the forward facet of the laser diode 25 is typically optically coupled to a communication or other transmission medium, such as an optical fiber, to transmit a data signal (as the optical output signal). The photodetector 20 is positioned at the rear facet for illumination by the laser diode 25, so that the photodetector 20 generates a corresponding photodetector current used for monitoring, by the optical midpoint controller 30, of the power levels of the optical output signal of the laser diode 25, as discussed below.

The power of the optical output (or optical output signal) from the laser diode 25, as indicated above, varies between the first optical power level and the second optical power level in accordance with the input data signal. The photodetector 20, optically coupled to the laser diode 25, converts the varying optical output signal power into a correspondingly varying photodetector current. As a consequence, the photodetector current varies with and tracks the laser output signal power, specifically varying with the first optical power level and the second optical power level. The optical midpoint controller 30 of the invention, coupled to the photodetector 20 and the laser diode 25, uses this corresponding photodetector current to determine how the laser diode 25 is performing. More specifically, the optical midpoint controller 30, through sampler 60, samples the photodetector current, and based on the photodetector current level, the optical midpoint controller 30 (through the forward bias current controller 5) will determine whether the laser diode 25 is providing output signal power having the appropriate, selected or predetermined optical midpoint power level, and will adjust the levels of forward bias current provided to the laser diode 25 accordingly. For example, if the optical midpoint controller 30 determines that the currently provided (or currently measured) optical midpoint power level is low compared to the predetermined optical midpoint power level, it will increase the level of forward bias current to drive the laser diode 25 at a correspondingly higher power level to achieve the selected or predetermined optical midpoint power level. Also for example, if the optical midpoint controller 30 determines that the currently provided (or currently measured) optical midpoint power level is high compared to the predetermined optical midpoint power level, it will decrease the level of forward bias current to drive the laser diode 25 at a correspondingly lower power level to achieve the selected or predetermined optical midpoint power level. Over time, these adjustments to the forward bias current will be in ever smaller increments, and as discussed in greater detail below, will then cause the laser diode 25 to generate and maintain over time an optical output signal having a significantly or substantially constant optical midpoint power level.

It should be noted that the laser diode current is maintained above the lasing threshold for both the first optical power level (optical 1) and the second optical power level (optical 0) to avoid an undesirable phenomenon commonly referred to in the art as turn-on time jitter or laser chirp. The optical midpoint controller 30, through the forward bias current controller 5, provides such as sufficient level of forward bias current, and further maintains a substantially constant, predetermined optical midpoint power level.

The modulation current provided by modulator 10 may be considered to be a first modulation current or first modulation current level, referred to herein as an $I_{MOD}(1)$ current, provided by the modulator 10 to the laser diode 25 for transmission of an optical 1 (logical one) at the first, higher optical power level, and a second modulation current or second modulation current level, referred to herein as an $I_{MOD}(0)$ current, provided by the modulator 10 to the laser diode 25 for transmission of an optical 0 (logical zero) at the second, lower optical power level. Therefore, the total current flowing through the laser diode 25 may be represented as a sum of the DC forward bias current, plus either a first modulation current ($I_{MOD}(1)$ current or current level) or a second modulation current ($I_{MOD}(0)$ current or current level), depending on whether transmission of an optical 1 or an optical 0 is required (based on the input data signal). These current levels and corresponding optical output signal power levels are also illustrated graphically in FIG. 3, and are discussed below.

Figure 2:
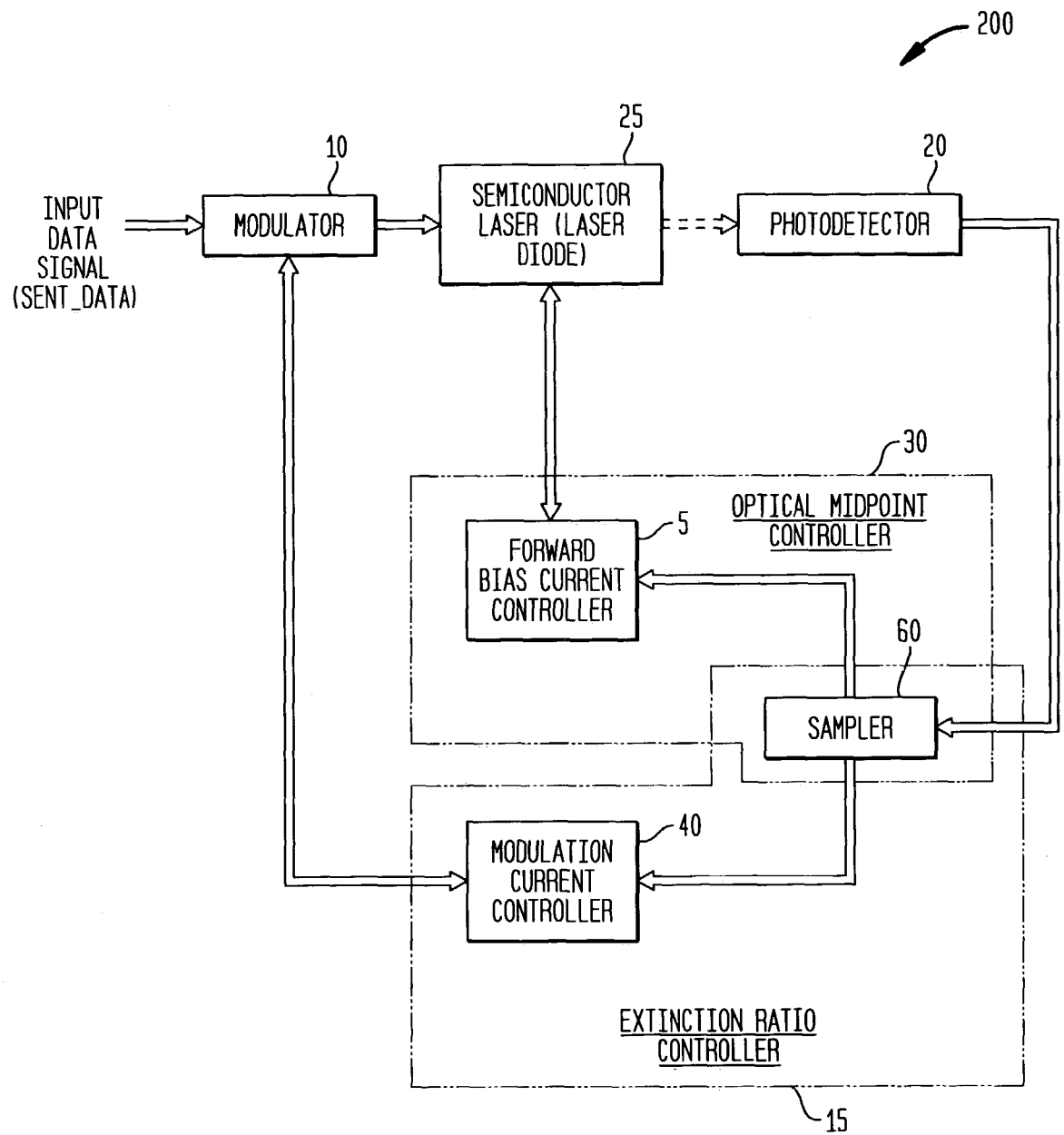
FIG. 2 is a block diagram of an exemplary second apparatus embodiment in accordance with the present invention.

FIG. 2 is a block diagram of an exemplary second apparatus embodiment 200 in accordance with the present invention. The exemplary apparatus 200 may be embodied as an integrated circuit, or as a portion of an integrated circuit having other, additional components. Typically, the apparatus 200 is also embodied with a semiconductor laser and photodetector as discrete components, and the remainder of the apparatus as an integrated circuit, with all such discrete or integrated embodiments considered equivalent and within the scope of the present invention.

Referring to FIG. 2, the apparatus 200 includes a semiconductor laser such as a laser diode 25, a modulator 10, a photodetector 20, an optical midpoint controller 30, and an extinction ratio controller 15. The extinction ratio controller 15 includes a sampler 60 and a modulation current controller 40. As illustrated, the sampler 60 may be shared by both the optical midpoint controller 30 and the extinction ratio controller 15. (Alternatively, the optical midpoint controller 30 and extinction ratio controller 15 may be embodied with each having its own, separate sampler 60). The laser diode 25, modulator 10, photodetector 20, and optical midpoint controller 30 operate as discussed above with reference to FIG. 1. The modulator 10, the optical midpoint controller 30, and the extinction ratio controller 15 also may be considered to comprise a "laser driver" which controls the operation of the laser diode 25.

In this apparatus 200, the amount or level of both first and second modulation currents provided by the modulator 10 to the laser diode 25, for the first optical power level and the second optical power level, respectively, is determined by the extinction ratio controller 15. As discussed above, the photodetector 20 is positioned at the rear facet for illumination by the laser diode 25, so that the photodetector 20 generates a corresponding photodetector current used for monitoring of the optical output signal power of the laser diode 25 by the optical midpoint controller 30, as discussed above, and by the extinction ratio controller 15.

The optical output signal power from the laser diode 25, as indicated above, varies between the first optical power level and the second optical power level in accordance with the input data signal. The photodetector 20, optically coupled to the laser diode 25, converts the varying optical output signal power into a correspondingly varying photodetector current. As a consequence, the photodetector current varies with and tracks the laser output signal power, specifically varying with the first optical power level and the second optical power level. The extinction ratio controller 15 of the invention, coupled to the photodetector 20 and the modulator 10, also uses this corresponding photodetector current to determine how the laser diode 25 is performing. More specifically, the sampler 60 samples the photodetector current, and based on the photodetector current level, the extinction ratio controller 15 (through the modulation current controller 40) will determine whether the laser diode 25 is providing output signal power having the appropriate, selected or predetermined extinction ratio, and will adjust the levels of modulation current provided to the laser diode 25 accordingly. For example, if the extinction ratio controller 15 determines that the currently provided extinction ratio is low, it will increase either or both the first and second levels of modulation current to drive the laser diode 25 at correspondingly higher power levels to achieve the selected or predetermined extinction ratio. Over time, these adjustments to the modulation current will be in ever smaller increments, and as discussed in greater detail below, will then cause the laser diode 25 to generate and maintain over time an optical output signal having a significantly or substantially constant extinction ratio.

Figure 3:
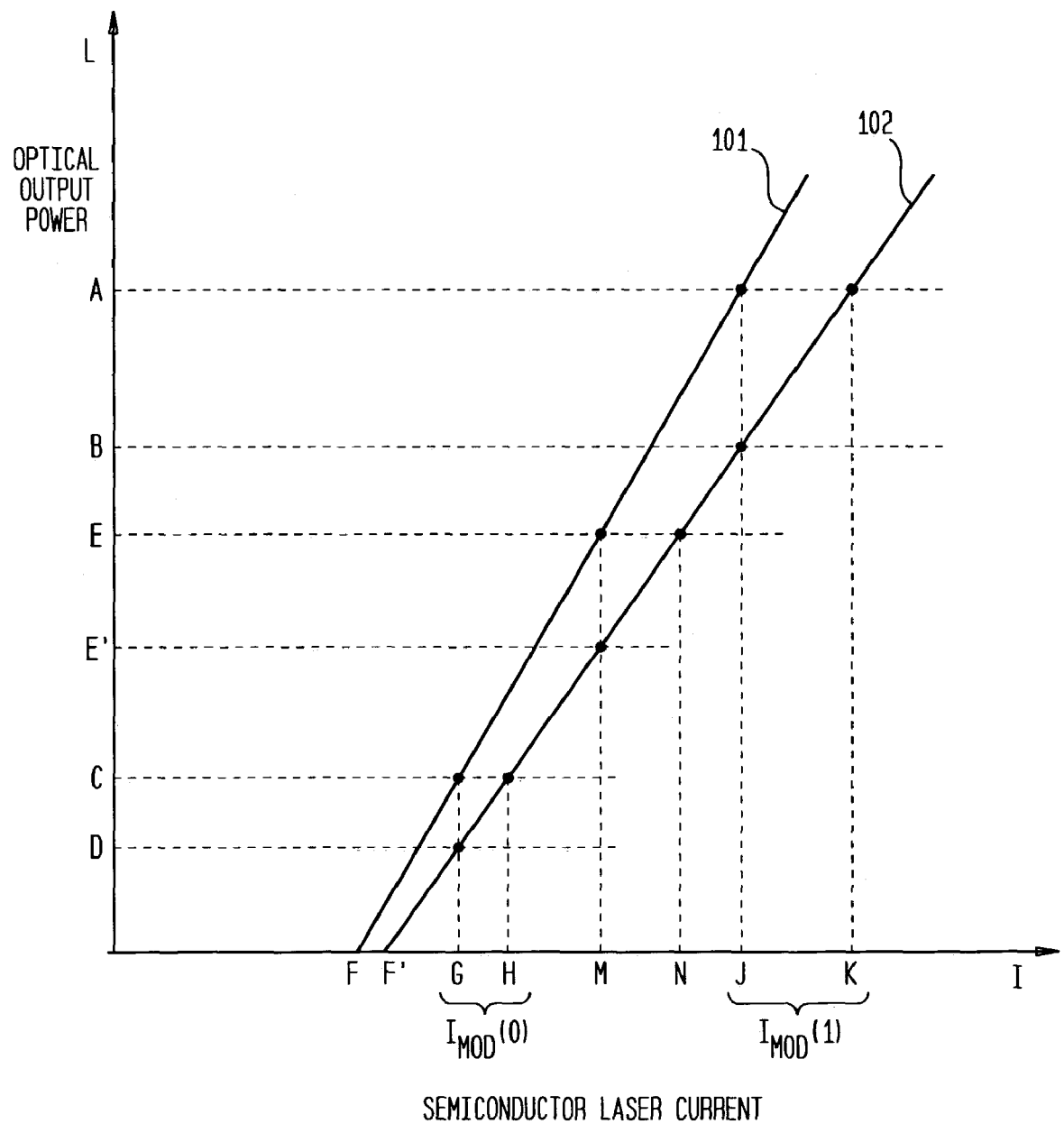
FIG. 3 is a graphical illustration of an exemplary transfer function for a semiconductor laser.

FIG. 3 is a graphical illustration of an exemplary transfer function for a semiconductor laser, illustrated as optical output power (L) as a function of laser diode 25 current (I) (forward bias current plus modulation current). As illustrated in FIG. 3, the desired or predetermined optical midpoint power level is "E", and the desired or predetermined extinction ratio is A/C (on line 101). This extinction ratio of A/C is a ratio of a first optical power level of "A" to a second optical power level of "C", using respective (corresponding) current levels of "J" (forward bias current plus $I_{MOD}(1)$ current) and "G" (forward bias current plus $I_{MOD}(0)$).

It should be noted that there are typically several different ways to combine the forward bias current and the various modulation currents ($I_{MOD}(1)$ current and $I_{MOD}(0)$ current), namely, through DC coupling or AC coupling (illustrated with reference to FIG. 4). For DC coupling (and with reference to the transfer function illustrated as line 101), the forward bias current may be set to a level of "G", directly providing a current level associated with an optical 0, $I_{MOD}(0)$ current equal to zero and $I_{MOD}(1)$ current equal to an amount (J−G). Alternatively and equivalently for DC coupling, the forward bias current may be set to a lasing threshold level of "F", with $I_{MOD}(0)$ current equal to an amount (G−F) and $I_{MOD}(1)$ current equal to an amount (J−F). Also alternatively and equivalently, for AC coupling (and with reference to the transfer function illustrated as line 101), the forward bias current may be set to a midpoint level of "M" (with the optical output power level midpoint "E" determined as the arithmetic average of the optical 1 ("A") level and the optical 0 ("C") level ((A+C)/2)), with $I_{MOD}(0)$ current equal to a negative value of magnitude (M−G) (i.e., −(M−G)), and $I_{MOD}(1)$ current equal to a positive value of magnitude (J−M).

Because laser diode performance varies over time, due to processing, aging, temperature of the laser diode, and so on, optical output power levels of the optical 1's and 0's also vary over time. As illustrated (on line 102), the laser threshold level has increased to "F", and optical output power levels have decreased for the same laser current levels, with the same current levels now providing a midpoint level of "E" and an extinction ratio of B/D, as a ratio of a first optical power level of "B" to a second optical power level of "D" (also using respective current levels of "J" (forward bias current plus $I_{MOD}(1)$) and "G" (forward bias current plus $I_{MOD}(0)$). As will be apparent from FIG. 3, such a change in the laser diode transfer function (laser performance) may be illustrated as a change in the slope of the L vs. I graph of FIG. 3 (and further illustrates a change in the modulation currents required to provide an optical 0 or an optical 1 at a desired optical output power levels and change in the forward bias current required to provide a desired midpoint power level).

In accordance with the present invention, to accommodate these variations in the laser diode characteristics (or transfer function characteristics) which may occur: (1) the change in optical midpoint power level will be determined, as a measured optical midpoint power level, and adjustments in the forward bias current level by the optical midpoint controller 30 are then used in order to maintain the optical midpoint power level at a substantially constant, predetermined level; and (2) the change in extinction ratio will be determined, as a measured extinction ratio, and adjustments in modulation current levels by the extinction ratio controller 15 are then used in order to maintain the extinction ratio at a substantially constant, predetermined level.

To maintain the predetermined optical midpoint power level of "E", the forward bias current level is changed, increasing the forward bias current level to F', to H, or to N, depending upon the selected embodiment. To maintain the predetermined extinction ratio of A/C (and with the corresponding change in forward bias current), corresponding modulation current levels are changed, using a first modulation current level of "K" for the first optical power level (forward bias current plus $I_{MOD}$ (1) current) and a second modulation current level of "H" for the second optical power level (forward bias current plus $I_{MOD}$ (0) current).

As mentioned above, there are typically several different ways to combine the forward bias current and the various modulation currents ($I_{MOD}$ (1) current and $I_{MOD}$ (0) current). For DC coupling (and with reference to the transfer function illustrated as line 102), the forward bias current may be set to a level of "H", directly providing a current level associated with an optical 0, with $I_{MOD}$ (0) current equal to zero and $I_{MOD}$ (1) current equal to an amount (K−H). Alternatively and equivalently for DC coupling, the forward bias current may be set to a lasing threshold level of "F", with $I_{MOD}$ (0) current equal to an amount (H−F') and $I_{MOD}$ (1) current equal to an amount (K−F'). Also alternatively and equivalently, for AC coupling (and with reference to the transfer function illustrated as line 102), the forward bias current may be set to a new midpoint level of "N", with $I_{MOD}$ (0) current equal to a negative value of magnitude (N−H) (i.e., −(N−H)), and $I_{MOD}$ (1) current equal to a positive value of magnitude (K−N).

In actual operation, the extinction ratio controller 15 operates in conjunction with an optical midpoint controller 30 to correspondingly determine and provide the modulation and forward bias currents for the laser diode 25. For example, the optical midpoint controller 30 will provide a forward bias current of F, G or M (for the various alternatives discussed with reference to the transfer function illustrated as line 101), and will provide a forward bias current of F', H or N (for the various alternatives discussed with reference to the transfer function illustrated as line 102). Depending upon the DC or AC embodiment, the extinction ratio controller 40 then provides the corresponding modulation currents ($I_{MOD}$ (1) current and $I_{MOD}$ (0) current) discussed above to maintain a substantially constant, predetermined extinction ratio of A/C, as illustrated in FIG. 3.

Referring again to FIGS. 1 and 2, the apparatuses 100 and 200 utilizes the photodetector 20 to detect the optical output signal power from the laser diode 25 and to convert the detected optical output signal power into a corresponding (electrical) photodetector current (i.e., the current through the photodetector 20 corresponds to and tracks the optical output signal). Using the photodetector current (as a form or type of signal) from the photodetector 20, the optical midpoint controller 30: (1) measures or otherwise determines the optical midpoint power level (discussed below in detail) presently being provided by the laser diode 25; (2) compares the measured optical midpoint power level with a selected, desired or predetermined optical midpoint power level; and (3) if and when the measured optical midpoint power level varies from the selected or predetermined optical midpoint power level, adjusts the forward bias current level (via the forward bias current controller 5) to cause the laser diode 25 to generate an optical output signal having the predetermined optical midpoint power level, and over time, having a substantially constant, predetermined optical midpoint power level.

When the optical midpoint controller 30 has determined that the measured optical midpoint power level varies from the selected or predetermined optical midpoint power level, there are innumerable different ways in which feedback may be provided to vary the forward bias current supplied to the laser diode 25. In many instances, depending upon the implementation of the apparatus 100 or 200, the type of feedback selected will vary accordingly. For example, the forward bias current controller 5 could be implemented with a variable current source to provide the appropriate level of forward bias current to achieve and maintain the predetermined optical midpoint power level. Also for example, as discussed below, the optical midpoint controller 30 may be implemented to provide a selected current path for the laser diode 25, of a plurality of varied or variable current paths, with the selected current path corresponding to the desired level of forward bias current for the laser diode 25, thereby allowing more or less forward bias current through the laser diode 25 to achieve the predetermined optical midpoint power level. Other forms of varying the forward bias current level of the laser diode 25 current may include, for example, switching one or more current paths to vary the forward bias current, providing variable resistance levels in a current path, and so on. As a consequence, it will be understood by those of skill in the art that all such implementations and their variations are considered equivalents hereto and are within the scope of the present invention.

Referring again to FIG. 2, and also using the photodetector current (as a form or type of signal) from the photodetector 20, the extinction ratio controller 15: (1) measures or otherwise determines the extinction ratio (discussed below in detail) presently being provided by the laser diode 25; (2) compares the measured extinction ratio with a selected, desired or predetermined extinction ratio; and (3) if and when the measured extinction ratio varies from the selected or predetermined extinction ratio, adjusts the first and second modulation current levels (via feedback through the modulator 10) to cause the laser diode 25 to generate an optical output signal having the predetermined extinction ratio, and over time, having a substantially constant, predetermined extinction ratio (i.e., the first power level and the second power level of the optical output signal form a substantially constant, predetermined extinction ratio).

When the extinction ratio controller 15 has determined that the measured extinction ratio varies from the selected or predetermined extinction ratio, there are also innumerable different ways in which feedback to the modulator 10 may be provided to vary the modulation current supplied to the laser diode 25. In many instances, depending upon the implementation of the modulator 10, the type of feedback selected will vary accordingly. For example, as discussed below with reference to FIG. 4, when the modulator 10 is implemented as a switching arrangement or differential amplifier (of modulator 110), the extinction ratio controller 15 is implemented (as extinction ratio controller 115) to provide a selected current path for the modulator, of a plurality of varied or variable current paths, with the selected current path corresponding to the desired level of current flow for the modulator, thereby allowing more or less current through the modulator 10 and laser diode 25 to achieve the predetermined extinction ratio. Other forms of varying the modulation of the laser diode 25 current may include, for example, switching one or more current paths to vary the modulation current, driving associated transistors at various voltage levels to provide varying current flow (such as varying the voltages at the bases or gates of driving transistors of a modulator), providing variable resistance levels in a current path, and so on. As a consequence, it will be understood by those of skill in the art that all such implementations and their variations are considered equivalents hereto and are within the scope of the present invention.

Figure 4:
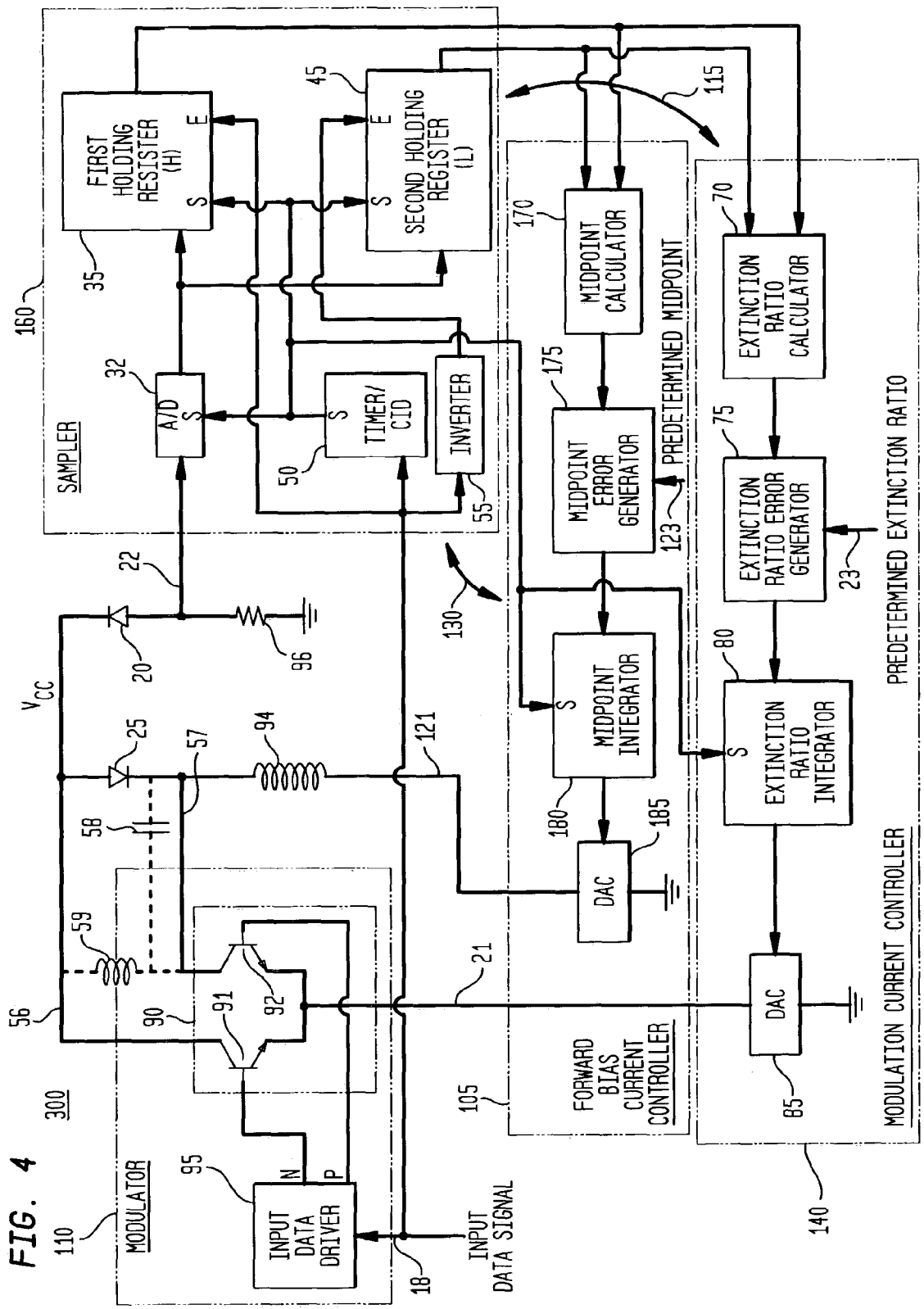
FIG. 4 is a block and circuit diagram of an exemplary third apparatus embodiment in accordance with the present invention.

FIG. 4 is a block and circuit diagram of an exemplary third apparatus embodiment 300 in accordance with the present invention. The exemplary third apparatus 300 may be embodied as an integrated circuit, or as a portion of an integrated circuit having other, additional components. Typically, the apparatus 300 is also embodied with a semiconductor laser and photodetector as discrete components, and the remainder of the apparatus as an integrated circuit, with all such discrete or integrated embodiments considered equivalent and within the scope of the present invention.

Similarly to the apparatuses 100 and 200 discussed above, the third apparatus 300 also includes a semiconductor laser such as the laser diode 25, a photodetector 20, a modulator 110, an extinction ratio controller 115 (comprised of sampler 160 and modulation current controller 140), and an optical midpoint controller 130 (comprised of sampler 160 and forward bias current controller 105). The modulator 110, the optical midpoint controller 130, and the extinction ratio controller 115 also may be considered to comprise a "laser driver" which controls the operation of the laser diode 25. While the input data signal (e.g., SENT_DATA) is provided to the modulator 110 (on line 18), in this embodiment, the input data signal is also provided as one of the inputs to the sampler 160 of the optical midpoint controller 130 and extinction ratio controller 115 (namely, to the timer/CID 50, the inverter 55, and register 35). The sampler 160 of the optical midpoint controller 130 and extinction ratio controller 115 also has an input of the photodetector current (on line or input 22). The extinction ratio controller 115 has an input of a value for the predetermined or selected extinction ratio (as a device setting, on line or input 23), and has an output (on line or output 21) to the modulator 110. The optical midpoint controller 130 also has an input of a value for the predetermined or selected optical midpoint power level (as a device setting, on line or input 123), and has an output (on line or output 121) to the laser diode 25 (via inductor 94).

It should be noted that the input of the photodetector current may be viewed or represented equivalently as a voltage level produced by the photodetector current through a known impedance, such as resistor 96 (such as for sampling of the voltage level representing the photodetector current by analog-to-digital converter ("A/D converter") 32); as a consequence, as used herein, the photodetector current (or photodetector current level) may be considered to equivalently mean and refer to the voltage level produced by the photodetector current through a known impedance (e.g., resistor 96). A power supply voltage, Vcc, is provided to the laser diode 25 on line 56. Also as will be appreciated by those of ordinary skill in the art, any of a plurality of types of semiconductor lasers and photodetectors may be used equivalently herein.

Also as discussed above with reference to FIGS. 1 and 2, the modulator 110 provides a modulation current to the laser diode 25, in response to an input data signal (on line or input 18), providing a first level of modulation current (a first modulation current or $I_{MOD}$ (1)) when the input data signal has a first logical state, and a second level of modulation current (a second modulation current or $I_{MOD}$ (0)) when the input data signal has a second logical state. In response to these levels of modulation current (and, having a forward bias current from forward bias current controller 105), the laser diode 25 is capable of transmitting an optical signal (representing first and second logical states (optical 1's and optical 0's)) corresponding to the input data signal. As mentioned above, when the input data signal is a logical one or high, the optical output signal has a first optical power level, and when the input data signal is a logical zero or low, the optical output signal has a second optical power level. Again, while the first optical power level is generally greater than the second optical power level, alternative logical assignments of data to optical power levels may be utilized within the scope of the present invention. Also, the amount or level of both the first modulation current and the second modulation current provided by the modulator 110 to the laser diode 25, for the first optical power level and the second optical power level, respectively, is determined by the extinction ratio controller 115, and the amount or level of forward bias current provided to the laser diode 25 is determined by the optical midpoint controller 130 (and is provided by the forward bias current controller 105).

The modulator 110 includes an input data driver (or drive circuit) 95 that receives the input data signal, and a differential amplifier 90 coupled to an output of the input data drive circuit 95. As illustrated, the bases of the transistors 91 and 92 comprising differential amplifier 90 are each coupled to an output of the input data driver 95, receiving input "N" (as an inverse of the input data (or DATA−)) and input "P" (as the input data (or DATA+)), which correspond to the first and second logic states of the input data signal. For example, as illustrated, the input data driver 95 converts the input data signal into a form suitable for use by the differential amplifier 90, such that the differential amplifier 90 is capable of providing the first modulation current level to the laser diode 25 when the input data signal has a first logical state (logical 1) and the second modulation current to the laser diode 25 when the input data signal has a second logical state (logical 0) (e.g., via transistors 91 and 92, as inputs "N" and "P", respectively). The differential amplifier 90 also may be considered equivalently to be a comparator or a switching arrangement, and numerous other equivalent implementations of modulator 110 will be apparent to those of skill in the art, as mentioned above. For purposes of the present invention, the modulator 10 need only provide current to the laser diode 25 for the laser diode to have appropriate first and second output optical power levels, in response to the input data signal. In addition, the modulator 110 of the invention should either, depending upon the selected embodiment: (1) be responsive to any adjustment signal or other information (such as a modulation adjustment signal) from the extinction ratio controller 115 to change the first or second modulation currents, such as, for example, by driving any applicable transistors at a different voltage levels to allow different levels of current flow; or (2) as discussed below, be configured to allow the extinction ratio controller 115 to directly change these modulation current levels, such as by providing a selected current path, of a plurality of varied or variable current paths, with the selected current path corresponding to the desired level of modulation current to achieve the predetermined extinction ratio.

The modulator 110 (through differential amplifier 90) may also have either an AC or DC coupling to the laser diode 25. As illustrated, when the collector of transistor 92 is coupled (via line 57) to the laser diode 25, DC coupling is provided. Alternatively, in lieu of DC coupling via line 57, AC coupling may be provided utilizing a capacitor 58 coupled between the laser diode 25 and the collector of transistor 92 and utilizing an inductor 59 coupled between the power supply voltage (Vcc on line 56) and the collector of the transistor 92, as illustrated with the dotted lines in FIG. 4.

As in FIGS. 1 and 2, the sampler 160 of the extinction ratio controller 115 and optical midpoint controller 130 of FIG. 4 has an input of the photodetector current (as a voltage level) from the photodetector 20, and in addition, an input of the input data signal. The extinction ratio controller 115 measures or determines a presently (i.e., currently) occurring extinction ratio (discussed below in detail), and if the measured extinction ratio varies from the predetermined extinction ratio, adjusts the modulation current to cause the laser diode to generate an optical output signal having the predetermined extinction ratio. The measured (or determined) extinction ratio, as a numerical value, is based on (1) a currently measured, optical power level, and (2) a previously measured and stored optical power level that represents a logical opposite of the currently measured optical power level. For example, when the currently measured optical output signal is at or about the first optical power level and represents a logical or optical one, then the previously measured and stored optical power level which is used to form the measured extinction ratio is for an optical output signal that is at or about the second optical power level and which represents a logical or optical zero. Similarly, when the currently measured optical output signal is at or about the second optical power level and represents a logical or optical zero, then the previously measured and stored optical power level which is used to form the measured extinction ratio is for an optical output signal that is at or about the first optical power level and which represents a logical or optical one.

The optical midpoint controller 130 measures or determines a presently (i.e., currently) occurring optical midpoint power level (discussed below in detail), and if the measured optical midpoint power level varies from the predetermined optical midpoint power level, adjusts the forward bias current to cause the laser diode 25 to generate an optical output signal having the predetermined optical midpoint power level. The measured (or determined) optical midpoint power level, as a numerical value, is also based on the arithmetic mean or average of (1) a currently measured, optical power level, and (2) a previously measured and stored optical power level that represents a logical opposite of the currently measured optical power level. (As indicated above, the measured optical midpoint power level may include scaling (linear or nonlinear) to reflect any differences between the optical output power levels from the semiconductor laser and the corresponding photodetector currents.) For example, when the currently measured optical output signal is at or about the first optical power level and represents a logical or optical one, then the previously measured and stored optical power level which is used to form the measured optical midpoint power level is for an optical output signal that is at or about the second optical power level and which represents a logical or optical zero. Similarly, when the currently measured optical output signal is at or about the second optical power level and represents a logical or optical zero, then the previously measured and stored optical power level which is used to form the measured optical midpoint power level is for an optical output signal that is at or about the first optical power level and which represents a logical or optical one.

As discussed in greater detail below, the measured optical midpoint power level may also be determined using a first plurality of samples of the photodetector current corresponding to the first optical power level and a second plurality of samples of the photodetector current corresponding to the second optical power level. The measured optical midpoint power level may then be determined as the overall arithmetic mean or average of a first mean value of the first plurality and a second mean value of the second plurality (e.g., measured optical midpoint power level=(H mean+L mean)/2). Phrased another way, the measured optical midpoint power level may be determined as an overall, total or combined mean or average of: (1) a first arithmetic mean of the first plurality of samples of the photodetector current corresponding to the first optical power level; and (2) a second arithmetic mean of the second plurality of samples of the photodetector current corresponding to the second optical power level. (It should be noted that if there are an equal number of samples within the first plurality and the second plurality, then the measured optical midpoint power level may be determined more simply as the arithmetic mean of both the first plurality and second plurality. It should also be noted that if there are an unequal number of samples within the first plurality and the second plurality, then the measured optical midpoint power level also may be determined more simply as a weighted arithmetic mean of both the first plurality and second plurality, with the weighting corresponding to the number or proportion of samples within each plurality. All such mean calculations or determinations are considered equivalent herein.)

The extinction ratio controller 115 and optical midpoint controller 130 include (and, as illustrated, share) a sampler 160 (equivalently a voltage or a current sampler). The sampler 160 includes an analog-to-digital converter ("AID converter") 32 coupled to the photodetector 20, a first (high) holding register 35 coupled to an output of the A/D converter 32, a second (low) holding register 45 coupled to the output of the A/D converter 32, a timer/CID 50, and an inverter 55. The A/D converter 32 receives as input the photodetector current (generally as a voltage, as discussed above). When indicated (or enabled) by the timer/CID 50 (as discussed below), the A/D converter 32 samples the photodetector current (generally, as a corresponding voltage level) and converts the sampled photodetector current (or voltage) into a digital form or digital value, referred to as a photodetector current indicator.

When enabled or indicated by the timer/CID 50, the A/D converter 32 provides a photodetector current indicator, as a digital value, corresponding to the photodetector current sample at that instant in time. As mentioned above, equivalently, the photodetector current may be monitored and sampled as a corresponding voltage level. The photodetector current at that instant in time corresponds to the optical output power of either a first logical state (logical 1) or a second logical state (logical 0). The timer/CID 50 indicates (as a timing signal, indicator or enable (illustrated as enable "S")) to the A/D converter 32 that the photodetector current should be sampled (and converted to a photodetector current indicator) when the input data signal indicates that a transition between first and second logical states has not occurred for a predetermined time period or for a predetermined number of bits (discussed below). When there has not been such a transition for a predetermined period of time or a predetermined number of bits (e.g., a certain number of consecutive bits have been identical, either all first logical states (1's) or all second logical states (0's)), the A/D converter 32 then samples the photodetector current and converts the photodetector current sample into a digital form, referred to as a photodetector current indicator, suitable for use by the modulation current controller 140 and forward bias current controller 105. Alternatively, the A/D converter 32 may continually sample the photodetector current, and convert the sampled photodetector current to a digital form, as a photodetector current indicator, only when similarly enabled by the timer/CID 50.

The timing indication or enable signal from the timer/CID 50 to sample the photodetector current and/or convert the sample to a photodetector current indicator is based on the "settling" time (or time to reach a steady-state) of the photodetector 20 and sampler 160 in the apparatus 300, which may be measured as a duration of time or as a sequential number of transmitted bits. Typically, the slowest component will be the photodetector 20, which requires a particular amount of time to receive light at either the first optical power level or the second optical power level to then produce a consistent, corresponding photodetector current which is representative of each of these power levels. As a consequence, the timer/CID 50 is set for the photodetector 20 and A/D converter 32 (of sampler 160) to settle, and is independent of the speed of the other components of the apparatus 200 illustrated in FIG. 4. The timer/CID 50 may be configured to determine either that a sufficient number of successive bits of the same logical state (consecutive logical 1's or logical 0's, as consecutive identical digits or "CIDs") have been received by the photodetector 20 (as corresponding to the input data signal), or that a sufficient period of time has elapsed for the receipt by the photodetector 20 of consecutive logical 1's or logical 0's. It should be noted that this timing or counting process is applicable to any slowest component, which may or may not be the photodetector 20. This use of the timer/CID 50, however, does permit the use of a photodetector 20 which is comparatively slower and has a comparatively more limited bandwidth (and, generally, may also be implemented at lower cost).

As a consequence, when either a predetermined period of time has elapsed or transmission of a predetermined number of bits having the same logical state (CID) has occurred, the timer/CID 50 will provide a corresponding indication or signal, referred to as a timing signal or timing enable. This timing signal is provided to a plurality of the components of the extinction ratio controller 115 and optical midpoint controller 130, as illustrated, namely, the A/D converter 32, the registers 35, 45, the extinction ratio integrator 80, and the midpoint integrator 180. When indicated by the timer/CID 50, the digital value representing a sample of a settled photodetector output current then provides a basis for accurate measurement of the actual extinction ratio and actual optical midpoint power level being provided by the laser diode 25. As a consequence, the timing signal is provided to enable the A/D converter 32, the registers 35, 45, the midpoint integrator 180 and the extinction ratio integrator 80, thereby providing that these components are enabled only when the current sample is considered accurate and valid. In the absence of the timing signal or timing enable, these components do not provide additional data for use in determining a measured extinction ratio and controlling the modulation current, and for use in determining a measured optical midpoint power level and controlling the forward bias current, such that the modulation current and the forward bias current then remains at their previous levels (i.e., the forward bias current level is kept stable and the modulation current remains at its most recent first and second modulation current levels).

As indicated above, the photodetector current indicator corresponds to either a first optical power level representative of a first logical state (logical 1) or a second optical power level representative of a second logical state (logical 0). Given that at least one photodetector current indicator for the first optical power level and at least one photodetector current indicator for the second optical power level are needed to determine the extinction ratio and to determine the optical midpoint power level, as these values are determined over time based on the data transmitted, the values are stored in separate, corresponding registers, with a first holding register 35 storing one or more photodetector current indicators of the first optical power level and with a second holding register 45 storing one or more photodetector current indicators of the second optical power level. As the photodetector current indicator from the A/D converter 32 may be for either the first optical power level or the second optical power level, the input data signal is utilized (with inverter 55) to correspondingly enable either the first holding register 35 or the second holding register 45 (via inverter 55) to store the photodetector current indicator (illustrated as enable "E"). For ease of reference, the photodetector current indicator corresponding to the first optical power level is referred to as a first photodetector current indicator, and the photodetector current indicator corresponding to the second optical power level is referred to as a second photodetector current indicator. For example, when enabled by the timing signal from the timer/CID 50, the digital value for the photodetector current sample is stored in the first holding register 35 when enabled by the input data signal (as indicating a logical 1), as a first photodetector current indicator, or is stored in the second holding register 45 when enabled by the inverted input data signal (as indicating a logical 0 which has been inverted by inverter 55), as a second photodetector current indicator. Depending upon the selected embodiment, the first holding register 35 may store a plurality of samples of the photodetector current for the first logical state, as a (first) plurality of first photodetector current indicators, and the second holding register 45 may store a plurality of samples of the photodetector current for the second logical state, as a (second) plurality of second photodetector current indicators.

Continuing to refer to FIG. 4, the forward bias current controller 105 comprises a midpoint calculator 170, a midpoint error generator 175, a midpoint integrator 180, and a (first) digital-to-analog converter ("DAC") 185.

The midpoint calculator 170 is coupled to the first and second holding registers 35, 45, and determines the measured optical midpoint power level of the laser diode 25. The midpoint calculator 170 may determine the measured optical midpoint power level as: (1) an average or mean value of a singular first photodetector current indicator and a singular second photodetector current indicator (i.e., determining a mean or average using a single sample of each of the photodetector current indicators which correspond to the first optical power level and the second optical power level); or (2) an average or mean value of (a) a first average value or arithmetic mean of a plurality of first photodetector current indicators and (b) a second average value or arithmetic mean of a plurality of second photodetector current indicators (i.e., forming an average or mean value using a first mean value of a first plurality of samples of the photodetector current corresponding to the first optical power level and a second mean value of a second plurality of samples of the photodetector current corresponding to the second optical power level). The midpoint calculator 170 (or the midpoint error generator 175) may also provide any needed scaling between the photodetector current indicators and the optical power levels provided by the semiconductor laser.

The midpoint error generator 175 has a first input coupled to the midpoint calculator 170, and has a second input (on line 123) to receive a predetermined or preset optical midpoint power level which has been selected or which is desired for the optical output power levels of the laser diode 25. The midpoint error generator 175 will determine a difference (or other variance), if any, between the predetermined optical midpoint power level and the measured optical midpoint power level, and provide a corresponding optical midpoint error signal. For example, the midpoint error generator 175 may be implemented as an adder (subtracter) or summer, subtracting the measured optical midpoint power level from (or adding an inverted measured optical midpoint power level to) the predetermined optical midpoint power level. The optical midpoint error signal has both a magnitude, as the absolute value of any difference between the predetermined optical midpoint power level and the measured optical midpoint power level, and has a sign, such that it will be positive when the measured optical midpoint power level is less than the predetermined optical midpoint power level, and will be negative when the measured optical midpoint power level is greater than the predetermined optical midpoint power level.

Subject to the various caveats discussed below, the optical midpoint error (signal) will then provide the basis for determining or varying the forward bias current of the laser diode 25 to maintain a substantially constant, predetermined optical midpoint power level (i.e., a substantially constant optical midpoint power level at a predetermined level). How the optical midpoint error is utilized will depend upon the selected embodiment of the apparatus 300, as mentioned above. For example, in an embodiment in which a separate current source provided forward bias current directly to the laser diode 25, the optical midpoint error signal (or as discussed below, its integrated form, as an integrated optical midpoint error signal) may be provided directly to such a current source, as a forward bias current adjustment signal, for use by the current source in directly varying the forward bias current of the laser diode 25 to provide a substantially constant, predetermined optical midpoint power level.

For the illustrated embodiment, however, the optical midpoint controller 130 determines the overall or total amount of forward bias current through the laser diode 25 (via inductor 94). Within the forward bias current controller 105, the DAC 185 is coupled to the laser diode 25 (via inductor 94) and provides this forward bias current control function; because the laser diode 25 must always have at least some forward bias current, in this embodiment the DAC 185 always provides at least some current to the laser diode 25 (via inductor 94), with the amount of forward bias current dependent upon, among other things, the predetermined optical midpoint power level and the optical midpoint error signal. To force the steady state optical midpoint error towards zero and filter the optical midpoint error signal to minimize control loop effects on the transmitted signal, the optical midpoint error signal is integrated (or summed) with previous optical midpoint error values by midpoint integrator 180. This integration of the optical midpoint error signal with previous error values by midpoint integrator 180, to form an integrated optical midpoint error signal, is utilized by the DAC 185 to determine an overall or total level of forward bias current for the laser diode 25, and provides that a corresponding positive, but variable, forward bias current level is provided by the DAC 185 to the laser diode 25 (via inductor 94).

As mentioned above, the integration by the midpoint integrator 180 is enabled by the timing signal (timing enable), such that a valid optical midpoint error signal is utilized before a change may be made to the integrated optical midpoint error signal, with corresponding effects on the forward bias current level. The DAC 185, in turn, as a variable current source/sink, then provides that indicated level of forward bias current, corresponding to the integrated optical midpoint error signal, to the laser diode 25 (via inductor 94). More particularly, using the integrated optical midpoint error signal, the DAC 185 converts the integrated optical midpoint error signal to a corresponding analog value indicative of the appropriate level of forward bias current, and provides a corresponding, selected current path (or current sink) from the laser diode 25 (via inductor 94) to a ground potential (of a plurality of varied or variable current paths), and thereby allows a corresponding level of forward bias current to flow through the laser diode 25 in order for the optical output power level of the laser diode 25 to have the predetermined optical midpoint power level. For example, the DAC 185 may provide a plurality of switchable current paths having differing impedance/resistance levels, and using control provided by the integrated optical midpoint error signal, will therefore provide different levels of current capacity when switched in or out of the path between the laser diode 25 and ground, e.g., with lower resistance paths allowing increased forward bias current, and so on. It will be apparent to those of skill in the art that myriad other equivalent DAC 185 implementations are also available.

It also will be apparent to those of skill in the art that when the apparatus 300 may be implemented using other equivalent arrangements, the DAC 185 (as a variable current source or sink) will be varied accordingly and, in some cases, the optical midpoint error may or may not need to be integrated or summed prior to being used to indicate or provide forward bias current levels. In such an equivalent embodiment, when an entity such as a variable current source is providing all of the forward bias current to the laser diode 25, the optical midpoint error signal may be applied directly to such a current source (for the current source to vary its own current levels, as mentioned above), as or as part of a forward bias current adjustment signal. Numerous other equivalent variations also will be apparent to those of skill in the art, and are within the scope of the present invention.

As a consequence, using the first and second photodetector current indicators (as digital values of photodetector current samples), or using corresponding averages of a plurality of each of the first and second photodetector current indicators, the forward bias current controller 105 determines or measures the optical midpoint power level of the laser diode 25 (through midpoint calculator 170), and compares (or determines the variance between) the measured optical midpoint power level and the predetermined optical midpoint power level (through midpoint error generator 175). In the event the measured optical midpoint power level varies from the predetermined optical midpoint power level, an optical midpoint error signal is generated, and is used to vary the forward bias current accordingly. In the illustrated embodiment, the optical midpoint error signal is used to vary the amount of forward bias current provided by the DAC 185 to the laser diode 25, by providing an indicator of the total or overall forward bias current level to be provided, as the integrated optical midpoint error signal from the midpoint integrator 180. As a consequence, due to this feedback arrangement, any variance between the measured optical midpoint power level and the predetermined optical midpoint power level is forced toward zero and becomes negligible, resulting in the laser diode 25 having a substantially constant optical midpoint power level at the predetermined or selected amount, namely, a substantially constant and predetermined optical midpoint power level.

Continuing to refer to FIG. 4, the modulation current controller 140 comprises an extinction ratio calculator 70, an extinction ratio error generator 75, an extinction ratio integrator 80, and a (second) digital-to-analog converter ("DAC") 85.

The extinction ratio calculator 70 is coupled to the first and second holding registers 35, 45, and determines the measured extinction ratio of the laser diode 25. As discussed in greater detail below, the extinction ratio calculator 70 may determine the measured extinction ratio as: (1) a ratio of a singular first photodetector current indicator to a singular second photodetector current indicator (i.e., forming a ratio using a single sample of each of the photodetector current indicators which correspond to the first optical power level and the second optical power level); or (2) as a ratio of a first average value or arithmetic mean of a plurality of first photodetector current indicators to a second average value or arithmetic mean of a plurality of second photodetector current indicators (i.e., forming a ratio using a plurality of samples of each of the photodetector current indicators corresponding to the first optical power level and the second optical power level).

The extinction ratio error generator 75 has a first input coupled to the extinction ratio calculator 70, and has a second input (on line 23) to receive a predetermined or preset extinction ratio value which has been selected or which is desired for the optical output power levels of the laser diode 25. The extinction ratio error generator 75 will determine a difference (or other variance), if any, between the predetermined extinction ratio and the measured extinction ratio, and provide a corresponding extinction ratio error signal. For example, the extinction ratio error generator 75 may be implemented as an adder (subtracter) or summer, subtracting the measured extinction ratio from (or adding an inverted measured extinction ratio to) the predetermined extinction ratio. The extinction ratio error signal also has both a magnitude, as the absolute value of any difference between the predetermined extinction ratio and the measured extinction ratio, and has a sign, such that it will be positive when the measured extinction ratio is less than the predetermined extinction ratio, and will be negative when the measured extinction ratio is greater than the predetermined extinction ratio.

Subject to the various caveats discussed below, the extinction ratio error (signal) will then provide the basis for determining or varying the first and second modulation current levels of the modulator 110 to maintain a substantially constant, predetermined extinction ratio (i.e., a substantially constant extinction ratio at a predetermined level). How the extinction ratio error is utilized will depend upon the selected embodiment of the modulator 110, as mentioned above. For example, in an embodiment in which the modulator were to provide the first and second modulation currents directly to the laser diode 25, the extinction ratio error signal (or as discussed below, its integrated form, as an integrated extinction ratio error signal) may be provided directly to the modulator, as a modulation current adjustment signal, for use by the modulator in directly varying the first and second modulation currents of the laser diode 25 to provide a substantially constant, predetermined extinction ratio.

For the illustrated embodiment, however, the extinction ratio controller 115 determines the overall or total amount of current through the modulator 110 and, in particular, through the differential amplifier (or switching arrangement) 90. Within the modulation current controller 140, the DAC 85 is coupled to the modulator 110 and provides this current control function; because the modulator 110 must always have at least some current to modulate the laser diode 25 in response to the input data signal, in this embodiment the DAC 85 always provides at least some current to the modulator 110, with the amount of current dependent upon, among other things, the predetermined extinction ratio and the extinction ratio error signal. To force the steady state extinction ratio error towards zero and filter the extinction ratio error signal to minimize control loop effects on the transmitted signal, the extinction ratio error signal is not provided directly to the modulator 110 to, for example, directly vary first and second modulation currents. Rather, the extinction ratio error signal is integrated (or summed) with previous error values by extinction ratio integrator 80. This integration of the extinction ratio error signal with previous extinction ratio error values by extinction ratio integrator 80, to form an integrated extinction ratio error signal, is utilized by the DAC 85 to determine an overall or total level of modulation current for the modulator 110, and provides that a corresponding positive, but variable, modulation current level is provided by the DAC 85 to the modulator 110.

As mentioned above, the integration by the extinction ratio integrator 80 is enabled by the timing signal (timing enable), such that a valid extinction ratio error signal is utilized before a change may be made to the integrated extinction ratio error signal, with corresponding effects on the modulation current levels. The DAC 85, in turn, as a variable current source/sink, then provides that indicated level of modulation current, corresponding to the integrated extinction ratio error signal, to the modulator 110. More particularly, using the integrated extinction ratio error signal, the DAC 85 converts the integrated extinction ratio error signal to a corresponding analog value indicative of the appropriate level of modulation current, and provides a corresponding, selected current path (or current sink) from the modulator 110 to a ground potential (of a plurality of varied or variable current paths), and thereby allows a corresponding level of modulation current to flow through the modulator 110 in order for the first optical power level and the second optical power level of the laser diode 25 to have the predetermined extinction ratio. For example, as discussed above for the DAC 185, the DAC 85 also may provide a plurality of switchable current paths having differing impedance/resistance levels, and using control provided by the integrated extinction ratio error signal, will therefore provide different levels of current capacity when switched in or out of the path between the modulator 110 and ground, e.g., with lower resistance paths allowing increased modulation current levels, and so on. It will be apparent to those of skill in the art that myriad other equivalent DAC 85 implementations are also available.

It also will be apparent to those of skill in the art that when the modulator 110 may be implemented using other equivalent arrangements, the DAC 85 (as a variable current source or sink) will be varied accordingly and, in some cases, the extinction ratio error may or may not need to be integrated or summed prior to being used to indicate or provide modulation current levels. In such an equivalent embodiment, when an entity separate from a modulator (such as the DAC 85) is not providing all of the current to the modulator, the extinction ratio error signal may be applied directly to a modulator (for the modulator to vary its own current levels, as mentioned above), as or as part of a modulation adjustment signal. Numerous other equivalent variations also will be apparent to those of skill in the art, and are within the scope of the present invention.

As a consequence, using the first and second photodetector current indicators (as digital values of photodetector current samples), or using corresponding averages of a plurality of each of the first and second photodetector current indicators, the modulation current controller 140 determines or measures the extinction ratio of the laser diode 25 (through extinction ratio calculator 70), and compares (or determines the variance between) the measured extinction ratio and the predetermined extinction ratio (through extinction ratio error generator 75). In the event the measured extinction ratio varies from the predetermined extinction ratio, an extinction ratio error signal is generated, and is used to vary the modulation current accordingly. In the illustrated embodiment, the extinction ratio error signal is used to vary the amount of modulation current provided by the DAC 85 to the modulator 110, by providing an indicator of the total or overall modulation current level to be provided, as the integrated extinction ratio error signal from the extinction ratio integrator 80. As a consequence, due to this feedback arrangement, any variance between the measured extinction ratio and the predetermined extinction ratio is forced toward zero and becomes negligible, resulting in the laser diode 25 having a substantially constant extinction ratio at the predetermined or selected level, namely, a substantially constant and predetermined extinction ratio.

It should be noted that the various apparatuses 100, 200 and 300 may be implemented using a wide range of equivalents. For purposes of example and not limitation, the optical midpoint controller and extinction ratio controller may be implemented utilizing: an A/D converter or other sampler; any type of memory (such as random access memory (RAM), flash, DRAM, SRAM, SDRAM, MRAM, FeRAM, ROM, EPROM or $E^2$PROM); a microprocessor (or digital signal processor, controller or other processor) programmed or configured to determine the various measured extinction ratio and optical midpoint, errors, integrated errors, and so on; and a variable current source or varied and switchable current paths; while the modulator, laser diode and photodetector may be implemented using known architectures and components, in addition to those illustrated. Numerous other equivalent implementations also will be apparent to those of skill in the art.

Figure 5A:
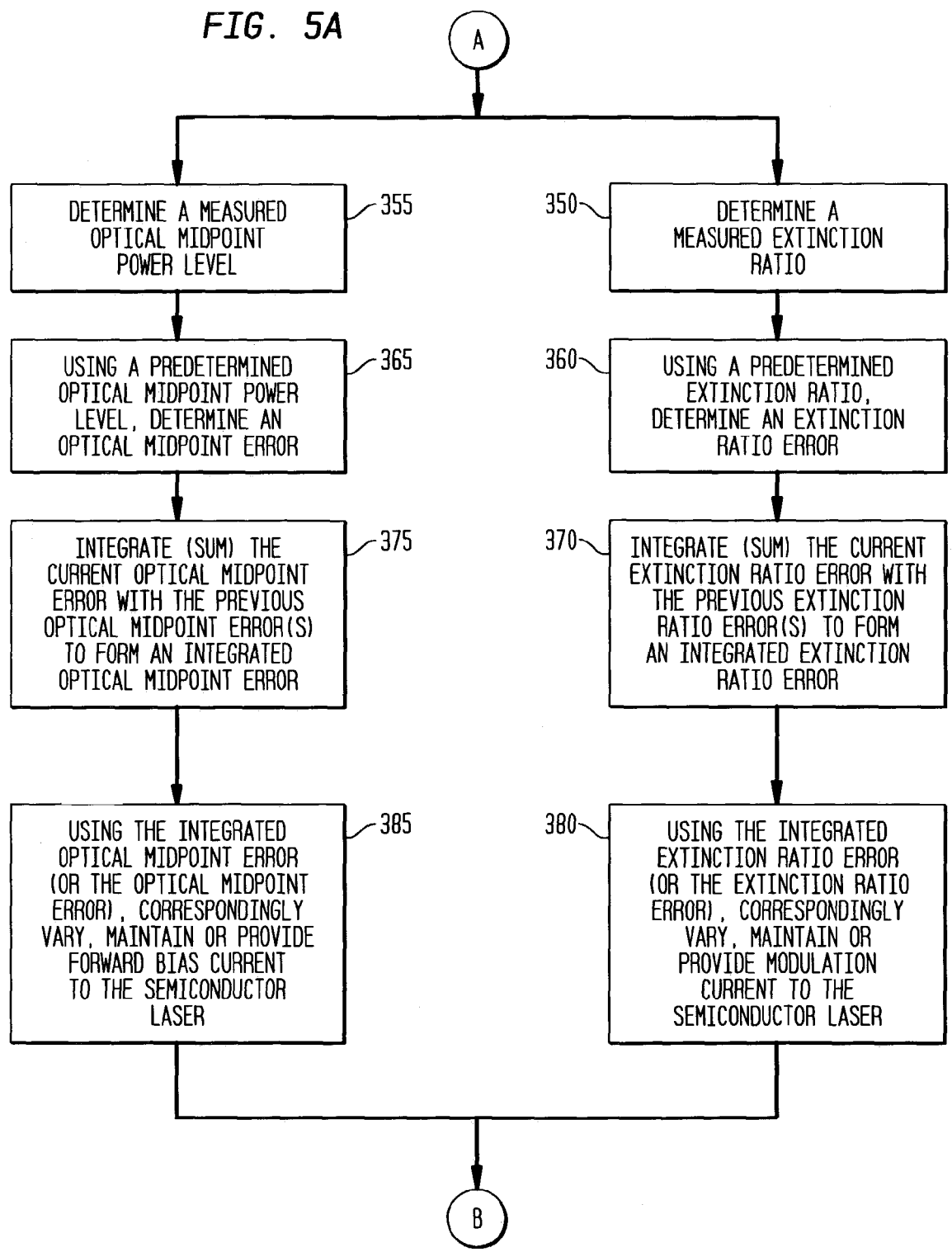

FIGS. 5 and 5A, collectively referred to herein as FIG. 5, are flow diagrams of an exemplary method embodiment 400 in accordance with the present invention, and provides a useful summary. In the exemplary embodiment, the method is performed on a continual basis during operation of the apparatus 100, 200 or 300, beginning with system or apparatus start up (step 305), adjusting the forward bias current and/or modulation current flowing through the laser diode 25, as needed, in order to generate an optical output signal having a substantially constant, predetermined optical midpoint power level and a substantially constant, predetermined extinction ratio. In addition, the illustrated method embodiment 300 utilizes the continual sampling of the photodetector current by the A/D converter 32, as mentioned above (rather than the other alternative of sampling only when specifically enabled by the timing signal).

Referring to FIG. 5, the photodetector current is sampled on a continuous basis, step 310, by the A/D converter 32. Concurrently, in step 315, the method determines whether an input data transition has occurred, in which successive or consecutive bits of the input data signal transition from one logical state to another logical state (e.g., a bit transition from a logical 0 to a logical 1 or vice-versa). When the input data transitions from one logical state to another in step 315, the timer/CID 50 is reset or initialized, to begin timing or counting from zero or another equivalent reference or initialization point (step 320). The method then determines whether a predetermined or minimum time period has elapsed (or a predetermined consecutive identical bit count has been reached) without another (or next) data transition, step 325, allowing for steady-state (or settled) levels to be reached, such as for the photodetector current. If the predetermined or minimum time period or bit count has not been reached before another data transition has occurred in step 325, the method returns to steps 310 and 315, to reset the timer or counter while continually sampling the photodetector current.

When the predetermined or minimum time period or bit count has been reached without another data transition in step 325, the sample of the photodetector current (from step 310) is converted to a digital form, as a photodetector current indicator, step 330. For example, the timer/CID 50 may "time out" and provide a timing or enable signal, indicating that the present photodetector current sample should be converted to digital form and used in subsequent extinction ratio and error determinations. As mentioned above, the predetermined time period or bit count is selected to allow the components of the apparatus 100, 200 or 300 to settle, if needed. Although the photodetector 20 (with its limited bandwidth) is typically the slowest component to settle, there may be instances where the speed of the photodetector 20 is not a factor and therefore use of the timer/CID 50 is optional (i.e., the operating speed of the photodetector 20 is substantially close to the bit rate of the optical output signal).

As mentioned above, when the photodetector current is not sampled continually, then following the timing enablement (of step 325), step 330 will include both sampling the photodetector current and converting the sample of the photodetector current to a digital value or form, as a photodetector current indicator, for use in the various extinction ratio determinations. Next, in step 335, using the input data signal, if the digital sample of the photodetector current is representative of the first logical state (logical 1), such that the sample corresponds to the first optical output power level, the corresponding digital value is stored in the first holding register 35, step 340, as a first photodetector current indicator. If the digital sample of the photodetector current is not representative of the first logical state (logical 1) in step 335, and is therefore representative of the second logical state (logical 0), the corresponding digital value is stored in the second holding register 45, step 345, as a second photodetector current indicator. As a consequence, either a comparatively high or low digital value is stored in its corresponding holding register, in response to a timing (or enable) signal from the timer/CID 50, and in response to the logical state of the input data signal. It should be noted that over time, in previous iterations (with the exception of the first several iterations following system start up), another digital sample of the photodetector current, which is representative of a logical opposite, will have been stored previously in the other holding register (i.e., a second photodetector current indicator in the second holding register 45 or a first photodetector current indicator in the first holding register 35).

Using the first photodetector current indicator from the first holding register 35 (which corresponds to a first or high optical power level and represents a first logical state) and the second photodetector current indicator from the second holding register 45 (which corresponds to a second or low optical power level and represents a second logical state), the method determines (step 350) a measured extinction ratio (using extinction ratio calculator 70) by forming a ratio, namely, dividing the first photodetector current indicator by the second photodetector current indicator. Concurrently, the method determines (step 355) a measured optical midpoint power level (using midpoint calculator 170) as an arithmetic average or mean of the first photodetector current indicator and the second photodetector current indicator. In a first embodiment, each of the first and second holding registers 35, 45 may store only a single digital sample of the photodetector current per register, so that the measured extinction ratio and the measured optical midpoint power level are then calculated using one first photodetector current indicator and one second photodetector current indicator.

In another embodiment, the first and second holding registers 35, 45 may each store a plurality of samples of the photodetector current, namely, a plurality of first photodetector current indicators and a plurality of second photodetector current indicators. In that event, in step 350, the extinction ratio calculator 70 may determine the measured extinction ratio as a ratio of a first average value (or arithmetic mean) of the plurality of first photodetector current indicators to a second average value (or arithmetic mean) of the plurality of second photodetector current indicators. Similarly, in step 355, the midpoint calculator 170 may determine the measured optical midpoint power level as an arithmetic average or mean of (a) first average value (or arithmetic mean) of the plurality of first photodetector current indicators, and (b) a second average value (or arithmetic mean) of the plurality of second photodetector current indicators (i.e., a total or overall mean value of a first arithmetic mean of a first plurality of samples of the photodetector current corresponding to the first optical power level and a second arithmetic mean of a second plurality of samples of the photodetector current corresponding to the second optical power level). Use of these averaged digital values may improve the noise immunity of the operation of the apparatus 100, 200 or 300.

Regardless of whether the measured optical midpoint power level (determined by the midpoint calculator 170) is based upon single samples of each of the first and second photodetector current indicators, or mean values of corresponding pluralities of samples, the measured optical midpoint power level (of step 355) is then compared, by the midpoint error generator 175, to the predetermined or otherwise selected or desired optical midpoint power level, to generate an optical midpoint error (step 365). The optical midpoint error represents the variance or difference (if any) between the measured optical midpoint power level determined from the optical output power of the laser diode 25 and the predetermined optical midpoint power level. It should be noted that the optical midpoint error, as discussed above, has a sign and a magnitude (substantially equal to the variance or difference between the measured optical midpoint power level and the predetermined optical midpoint power level), and that in the event the difference or variance is zero, the optical midpoint error is also zero. It should also be noted that over time, the optical midpoint error will be forced to zero, also as discussed above, such that the laser diode output power levels provide a substantially constant, predetermined optical midpoint power level. Selection of the predetermined optical midpoint power level may be based on a number of factors, including receiver. sensitivity, optical transmission loss, noise environment, etc. If the measured optical midpoint power level is less than the predetermined optical midpoint power level, the optical midpoint error is represented as a positive value, and if more than the predetermined optical midpoint power level, the optical midpoint error is represented as a negative value.

Depending upon the apparatus configuration, the optical midpoint error, if any, may be used directly to correspondingly vary the forward bias current of the laser diode 25, step 385, to provide a substantially constant, predetermined optical midpoint power level. As mentioned above, for the illustrated apparatus 300 embodiment, an additional step is utilized, in which the optical midpoint error, as a digital value, is summed or integrated with a plurality of previous optical midpoint errors (as a sum of a plurality of digital values from previous iterations), to form an integrated optical midpoint error, step 375. More specifically, the present optical midpoint error is effectively added to (or subtracted from) the previous integrated optical midpoint error, as a running sum. For example, if a first optical midpoint error is equivalent to +0.5 and a second optical midpoint error is equivalent to −0.06, then the integrated optical midpoint error becomes +0.44; if a third optical midpoint error is equivalent to +0.01, the integrated optical midpoint error will be +0.45; and if a fourth optical midpoint error is equivalent to 0.00, the integrated optical midpoint error will continue to be +0.45. For the illustrated embodiment, the integrated optical midpoint error is then used to correspondingly vary or provide (through DAC 185) the forward bias current of the laser diode 25, step 385, to provide a substantially constant, predetermined optical midpoint power level. Depending upon the selected embodiment, the integrated optical midpoint error signal may be converted (e.g., scaled and converted to an analog form), as an indicator of the desired forward bias current level, for use by the DAC 185 (or use directly by a current source) to provide a corresponding level of forward bias current. Again, as the optical midpoint error tends toward zero, it will be apparent that over time, any adjustment in step 385 will also become negligible or zero, with the forward bias current maintained at previous levels. For the apparatus 300, of a plurality of varied or variable current paths, the DAC 185 provides a corresponding, selected current path to ground for the laser diode 25 (via inductor 94), providing a forward bias current level corresponding to the integrated optical midpoint error.

Also regardless of whether the measured extinction ratio value (determined by the extinction ratio calculator 70) is based upon single samples of each of the first and second photodetector current indicators, or mean values of a plurality of samples, the measured extinction ratio (of step 350) is then compared, by the extinction ratio error generator 75, to the predetermined or otherwise selected or desired extinction ratio value, to generate an extinction ratio error (step 360). The extinction ratio error represents the variance or difference (if any) between the measured extinction ratio determined from the optical output power of the laser diode 25 and the predetermined extinction ratio value. It should be noted that the extinction ratio error, as discussed above, has a sign and a magnitude (substantially equal to the variance or difference between the measured extinction ratio and the predetermined extinction ratio), and that in the event the difference or variance is zero, the extinction ratio error is also zero. It should also be noted that over time, the extinction ratio error will be forced to zero, also as discussed above, such that the laser diode output power levels provide a substantially constant, predetermined extinction ratio. Selection of the predetermined extinction ratio also may be based on a number of factors, including receiver sensitivity, optical transmission loss, noise environment, etc. If the measured extinction ratio is less than the predetermined extinction ratio, the extinction ratio error is represented as a positive value, and if more than the predetermined extinction ratio, the extinction ratio error value is represented as a negative value.

Depending upon the modulator 110 (or modulator 10) configuration, the extinction ratio error, if any, may be used directly to correspondingly vary the modulation current of the laser diode 25, step 380, to provide a substantially constant, predetermined extinction ratio. As mentioned above, for the illustrated apparatus 300 embodiment, an additional step is utilized, in which the extinction ratio error, as a digital value, is summed or integrated with a plurality of previous extinction ratio errors (as a sum of a plurality of digital values from previous iterations), to form an integrated extinction ratio error, step 370. More specifically, the present extinction ratio error is effectively added to (or subtracted from) the previous integrated extinction ratio error, as a running sum. For example, if a first extinction ratio error is equivalent to +0.3 and a second extinction ratio error is equivalent to −0.08, then the integrated extinction ratio error becomes +0.22; if a third extinction ratio error is equivalent to +0.01, the integrated extinction ratio error will be +0.23; and if a fourth extinction ratio error is equivalent to 0.00, the integrated extinction ratio error will continue to be +0.23. For the illustrated embodiment, the integrated extinction ratio error is then used to correspondingly vary or provide (through DAC 85) the modulation current of the laser diode 25, step 380, to provide a substantially constant, predetermined extinction ratio. Depending upon the selected embodiment, the integrated extinction ratio error signal may be converted (e.g., scaled and converted to an analog form), as an indicator of the desired modulation current level, for use by the DAC 85 (or use directly by a modulator) to provide a corresponding level of modulation current. Again, as the extinction ratio error tends toward zero, it will be apparent that over time, any adjustment in step 380 will also become negligible or zero, with the modulation current maintained at previous levels. For the apparatus 300, of a plurality of varied or variable current paths, the DAC 85 provides a corresponding, selected current path to ground for the modulator, providing a modulation current level corresponding to the integrated extinction ratio error.

Following steps 380 and 385, the method then returns to steps 310 and 315, to continually monitor and determine the measured optical midpoint power level of the laser diode 25, and provide any corresponding adjustments to the forward bias current, and also to continually monitor and determine the measured extinction ratio of the laser diode 25, and provide any corresponding adjustments to the modulation current.

In summary, the method of controlling an optical midpoint power level of a semiconductor laser, in accordance with the present invention, includes: (a) modulating the semiconductor laser at a first modulation level when the input data signal has a first logical state and modulating the semiconductor laser at a second modulation level when the input data signal has a second logical state; (b) transmitting an optical signal having a first optical power level in response to the first modulation level and having a second optical power level in response to the second modulation level, the first optical power level being greater than the second optical power level; (c) detecting the first optical power level and the second optical power level; (d) determining a measured optical midpoint power level as an arithmetic mean of the first optical power level and the second optical power level; (e) determining an optical midpoint error as a variance between the measured optical midpoint power level and a predetermined optical midpoint power level; and (f) using the optical midpoint error, adjusting the forward bias current of the semiconductor laser to generate the optical signal having substantially the predetermined optical midpoint power level.

The adjustment step (step (f)) may also include integrating the optical midpoint error with a plurality of previous optical midpoint errors to form an integrated optical midpoint error; and either adjusting the forward bias current of the semiconductor laser in response to the integrated optical midpoint error (or integrated optical midpoint error signal), or adjusting the forward bias current of the semiconductor laser by providing a selected current path for the semiconductor laser, with the selected current path corresponding to the integrated optical midpoint error (or signal).

The optical signal detection step (step (c)) may be performed by detecting the first optical power level by sampling a first photodetector current generated by the first optical power level to form a first photodetector current indicator and detecting the second optical power level by sampling a second photodetector current generated by the second optical power level to form a second photodetector current indicator. This sampling of the first photodetector current and the second photodetector current may be performed by sampling corresponding voltage levels.

As discussed above, the measured optical midpoint power level may be determined as an arithmetic mean of the first photodetector current indicator and the second photodetector current indicator, or as a total arithmetic mean of a first arithmetic mean of a (first) plurality of samples of the first photodetector current and a second arithmetic mean of a (second) plurality of samples of the second photodetector current. In addition, the photodetector current levels are sampled when the input data signal has a predetermined number of consecutive identical bits (having either the first or the second logical state), or when the input data signal has one (first or second) logical state for a predetermined period of time.

As mentioned above, the feedback provided by the present invention will generally force the optical midpoint error to zero, providing a forward bias current such that the laser diode 25 provides a substantially constant, predetermined optical midpoint power level, with minimal further adjustment of the forward bias current unless and until laser operating conditions or characteristics change. As will be appreciated by those of ordinary skill in the art, the DAC 185 or an equivalent device may be configured in any number of ways to adjust or provide the forward bias current through the laser diode 25.

For example, if the measured optical midpoint power level is less than the predetermined or selected optical midpoint power level, providing a corresponding, positive optical midpoint error, the integrated optical midpoint error will correspondingly increase, the DAC 185 will provide for a correspondingly increased current path, which in turn, will allow more forward bias current through the laser diode 25. This will result in a larger measured optical midpoint power level, and a smaller optical midpoint error in subsequent iterations. If the measured optical midpoint power level is greater than the predetermined or selected optical midpoint power level, providing a negative optical midpoint error, the integrated optical midpoint error will correspondingly decrease, the DAC 185 will provide for a correspondingly decreased current path, which in turn, will allow less current through the laser diode 25. This will result in a smaller measured optical midpoint power level, and a smaller optical midpoint error in subsequent iterations. In this way, operation of the optical midpoint controller 130 (via closed loop feedback) adjusts the forward bias current through the laser diode 25 until the optical midpoint error is substantially zero and the laser diode 25 provides a substantially constant, predetermined optical midpoint power level.

Also in summary, the method of controlling an extinction ratio of a semiconductor laser, in accordance with the present invention, includes: (a) modulating the semiconductor laser at a first modulation level when the input data signal has a first logical state and modulating the semiconductor laser at a second modulation level when the input data signal has a second logical state; (b) transmitting an optical signal having a first optical power level in response to the first modulation level and having a second optical power level in response to the second-modulation level, the first optical power level being greater than the second optical power level; (c) detecting the first optical power level and the second optical power level; (d) determining a measured extinction ratio as a ratio of the detected first optical power level to the detected second optical power level; (e) determining an extinction ratio error as a variance between the measured extinction ratio and a predetermined extinction ratio; and (f) using the extinction ratio error, adjusting the modulation of the semiconductor laser to generate the optical signal substantially having the predetermined extinction ratio.

The adjustment step (step (f)) may also include integrating the extinction ratio error with a plurality of previous extinction ratio errors to form an integrated extinction ratio error; and either adjusting the modulation of the semiconductor laser in response to the integrated extinction ratio error (or integrated extinction ratio error signal), or adjusting the modulation of the semiconductor laser by providing a selected current path for the modulator, with the selected current path corresponding to the integrated extinction ratio error (or signal).

Similarly, the optical signal detection step (step (c)) also may be performed by detecting the first optical power level by sampling a first photodetector current generated by the first optical power level to form a first photodetector current indicator and detecting the second optical power level by sampling a second photodetector current generated by the second optical power level to form a second photodetector current indicator. This sampling of the first photodetector current and the second photodetector current may be performed by sampling corresponding voltage levels.

As discussed above, the measured extinction ratio may be determined as a ratio the first photodetector current indicator to the second photodetector current indicator, or as a ratio of a first arithmetic mean of a plurality of samples of the first photodetector current to a second arithmetic mean of a plurality of samples of the second photodetector current. In addition, the photodetector current levels are sampled when the input data signal has a predetermined number of consecutive identical bits (having either the first or the second logical state), or when the input data signal has one (first or second) logical state for a predetermined period of time.

As mentioned above, the feedback provided by the present invention will generally force the extinction ratio error to zero, providing a modulation current such that the laser diode 25 provides a substantially constant, predetermined extinction ratio, with minimal further adjustment of the modulation current unless and until laser operating conditions or characteristics change. As will be appreciated by those of ordinary skill in the art, the DAC 85 or an equivalent device may be configured in any number of ways to adjust or provide the modulation current through the modulator 110 or modulator 10 and the laser diode 25.

For example, if the measured extinction ratio is less than the predetermined or selected extinction ratio, providing a corresponding, positive extinction ratio error, the integrated extinction ratio error will correspondingly increase, the DAC 85 will provide for a correspondingly increased current path, which in turn, will allow more current through the modulator 110 and laser diode 25. This will result in a larger measured extinction ratio value, and a smaller extinction ratio error in subsequent iterations. If the measured extinction ratio value is greater than the predetermined or selected extinction ratio, providing a negative extinction ratio error, the integrated extinction ratio error will correspondingly decrease, the DAC 85 will provide for a correspondingly decreased current path, which in turn, will allow less current through the modulator 110 and laser diode 25. This will result in a smaller measured extinction ratio value, and a smaller extinction ratio error in subsequent iterations. In this way, operation of the extinction ratio controller 115 (via closed loop feedback) adjusts the current through the laser diode 25 until the extinction ratio error is substantially zero and the laser diode 25 provides a substantially constant, predetermined extinction ratio.

Another advantage of the present invention concerns use of the timer/CID 50 to control the timing of calculations and the corresponding bandwidth required to implement the invention. Although the methodology runs on a continuous basis, the measured optical midpoint power level and the measured extinction ratio are not calculated continuously, but only when a predetermined number of consecutive identical digits have been transmitted or the same digit has been transmitted for a predetermined period of time (based on the input data signal). As a consequence, the present invention may accommodate a lower bandwidth (compared to the frequency of data transitions or data rate) of components such as the photodetector, while maintaining accurate feedback and significant control of the semiconductor laser optical midpoint power level and extinction ratio.

Yet additional advantages of the present invention may be further apparent to those of skill in the art. The various embodiments of the present invention may be advantageously combined with other aspects of laser control. For example, the optical midpoint power level control may be combined with extinction ratio control, to provide significant control over laser operation utilizing shared resources.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention claimed is:

1. An integrated circuit, the integrated circuit couplable to a semiconductor laser and to a photodetector, the photodetector optically couplable to the semiconductor laser, the semiconductor laser capable of transmitting an optical signal in response to a modulation current, and the photodetector capable of converting the optical signal into a photodetector current, the integrated circuit comprising:

a modulator couplable to the semiconductor laser, the modulator capable of providing the modulation current to the semiconductor laser, the modulation current corresponding to an input data signal, wherein the modulator is further capable of providing a first modulation current level to the semiconductor laser when the input data signal has a first logical state and providing a second modulation current level to the semiconductor laser when the input data signal has a second logical state, the first modulation current level being greater than the second modulation current level;

wherein the semiconductor laser is further capable of providing the optical signal having a first optical power level in response to the first modulation current level and having a second optical power level in response to the second modulation current level, the first optical power level being greater than the second optical power level;

wherein the photodetector is further capable of generating a first photodetector current level in response to the first optical power level and a second photodetector current level in response to the second optical power level; and an optical midpoint controller couplable to the photodetector and couplable to the semiconductor laser, the optical midpoint controller capable of:

in response to the photodetector current, adjusting a forward bias current of the semiconductor laser, so that the semiconductor laser generates the optical signal with a power level approximate to a predetermined optical midpoint power level, said predetermined optical midpoint power level determined by calculating an arithmetic mean of a plurality of optical power levels;

sampling the first photodetector current level to form a plurality of first photodetector current indicators;

sampling the second photodetector current level to form a plurality of second photodetector current indicators;

determining a measured optical midpoint power level as an overall mean of a first arithmetic mean of the plurality of first photodetector current indicators and a second arithmetic mean of the plurality of second photodetector current indicators; and determining a variance between the measured optical midpoint power level and the predetermined optical midpoint power level, and based on the variance, forming an optical midpoint error signal.

2. The integrated circuit of claim 1, wherein the optical midpoint controller is further capable of integrating the optical midpoint error signal with a plurality of previous optical midpoint error signals to form an integrated optical midpoint error signal; and wherein the optical midpoint controller is further capable of adjusting the forward bias current by providing a selected current path for the semiconductor laser, the selected current path corresponding to the integrated extinction ratio error signal.

3. The integrated circuit of claim 1, wherein the optical midpoint controller is capable of sampling the first photodetector current level to form a first photodetector current indicator, sampling the second photodetector current level to form a second photodetector current indicator, determining a measured optical midpoint power level as an arithmetic mean of the first photodetector current indicator and the second photodetector current indicator, determining a variance between the measured optical midpoint power level and the predetermined optical midpoint power level and, based on the variance, forming an optical midpoint error signal.

4. The integrated circuit of claim 3, wherein the optical midpoint controller is capable of sampling the first photodetector current level and the second photodetector current level by sampling corresponding voltage levels.

5. The integrated circuit of claim 3, wherein the optical midpoint controller is enabled to sample the first photodetector current level when the input data signal has a predetermined number of consecutive bits having the first logical state and is enabled to sample the second photodetector current level when the input data signal has a predetermined number of consecutive bits having the second logical state.

6. The integrated circuit of claim 3, wherein the optical midpoint controller is enabled to sample the first photodetector current level when the input data signal has the first logical state for a predetermined period of time and is enabled to sample the second photodetector current level when the input data signal has the second logical state for the predetermined period of time.

7. The integrated circuit of claim 3, wherein the optical midpoint controller is further capable of integrating the optical midpoint error signal with a plurality of previous optical midpoint error signals to form an integrated optical midpoint error signal; and wherein the optical midpoint controller is further capable of adjusting the forward bias current in response to the integrated optical midpoint error signal.

8. The integrated circuit of claim 3, wherein the optical midpoint controller is further capable of integrating the optical midpoint error signal with a plurality of previous optical midpoint error signals to form an integrated optical midpoint error signal; and wherein the optical midpoint controller is further capable of adjusting the forward bias current by providing a selected current path for the semiconductor laser, the selected current path corresponding to the integrated optical midpoint error signal.

9. The integrated circuit of claim 3, wherein the optical midpoint controller is further capable of providing, in response to the optical midpoint error signal, a forward bias current adjustment signal to a variable current source, and wherein, in response to the forward bias current adjustment signal, the variable current source is capable of adjusting the forward bias current of the semiconductor laser to generate the optical signal having a substantially constant, predetermined optical midpoint power level.

10. The integrated circuit of claim 1, wherein the optical midpoint controller further comprises:

a sampler coupled to the photodetector, the sampler capable of sampling the first photodetector current level to form a plurality of first photodetector current indicators and sampling the second photodetector current level to form a plurality of second photodetector current indicators; and a forward bias current controller coupled to the sampler and couplable to the semiconductor laser, the forward bias current controller capable of determining a measured optical midpoint power level as an overall arithmetic mean of a first arithmetic mean of the plurality of first photodetector current indicators and a second arithmetic mean of the plurality of second photodetector current indicators, and comparing the measured optical midpoint power level to the predetermined optical midpoint power level to form an optical midpoint error signal.

11. The integrated circuit of claim 1, wherein the optical midpoint controller further comprises:

a sampler coupled to the photodetector, the sampler capable of sampling the first photodetector current level to form a first photodetector current indicator and sampling the second photodetector current level to form a second photodetector current indicator; and a forward bias current controller coupled to the sampler and couplable to the semiconductor laser, the forward bias current controller capable of determining a measured optical midpoint power level as an arithmetic mean of the first photodetector current indicator and the second photodetector current indicator, and further capable of comparing the measured optical midpoint power level to the predetermined optical midpoint power level to form an optical midpoint error signal.

12. The integrated circuit of claim 11, wherein the sampler further comprises:

an analog-to-digital converter coupled to the photodetector, the analog-to-digital converter capable of sampling the first photodetector current level to form a first photodetector current indicator and sampling the second photodetector current level to form a second photodetector current indicator; and a timer coupled to the analog-to-digital converter, the timer capable of enabling the analog-to-digital converter to sample the first photodetector current level when the input data signal has a predetermined number of consecutive bits having the first logical state and enabling the analog-to-digital converter to sample the second photodetector current level when the input data signal has a predetermined number of consecutive bits having the second logical state.

13. The integrated circuit of claim 11, wherein the sampler further comprises:

an analog-to-digital converter coupled to the photodetector, the analog-to-digital converter capable of sampling the first photodetector current level to form a first photodetector current indicator and sampling the second photodetector current level to form a second photodetector current indicator; and a timer coupled to the analog-to-digital converter, the timer capable of enabling the analog-to-digital converter to sample the first photodetector current level when the input data signal has the first logical state for a predetermined period of time and enabling the analog-to-digital converter to sample the second photodetector current level when the input data signal has the second logical state for the predetermined period of time.

14. The integrated circuit of claim 11, wherein the sampler further comprises:
a first register coupled to the analog-to-digital converter, the first register capable of storing the first photodetector current indicator when the input data signal has a first logical state; and
a second register coupled to the analog-to-digital converter, the second register capable of storing the second photodetector current indicator when the input data signal has a second logical state.

15. The integrated circuit of claim 11, wherein the forward bias current controller further comprises:
a midpoint calculator coupled to the sampler, the midpoint calculator capable of determining a measured optical midpoint power level as an arithmetic mean of the first photodetector current indicator and the second photodetector current indicator; and
a midpoint error generator coupled to the midpoint calculator, the midpoint error generator capable of determining a variance between the measured optical midpoint power level and the predetermined optical midpoint power level and, corresponding to the variance, forming the optical midpoint error signal.

16. The integrated circuit of claim 15, wherein the forward bias current controller further comprises:
a midpoint integrator coupled to the midpoint error generator, the midpoint integrator capable of summing the optical midpoint error signal with a plurality of previous optical midpoint error signals to form an integrated optical midpoint error signal; and
a digital-to-analog converter coupled to the midpoint integrator, the digital-to-analog converter capable of adjusting the forward bias current by providing a selected current path for the semiconductor laser, the selected current path corresponding to the integrated optical midpoint error signal.

17. The integrated circuit of claim 1, further comprising:
an extinction ratio controller couplable to the photodetector and coupled to the modulator, the extinction ratio controller, in response to the photodetector current, capable of adjusting the modulation current provided by the modulator to the semiconductor laser to generate the optical signal having substantially a predetermined extinction ratio.

18. The integrated circuit of claim 17, wherein the extinction ratio controller is further capable of:
sampling the first photodetector current level to form a first photodetector current indicator;
sampling the second photodetector current level to form a second photodetector current indicator;
determining a measured extinction ratio as a ratio of the first photodetector current indicator to the second photodetector current indicator;
determining a variance between the measured extinction ratio and the predetermined extinction ratio, and based on the variance, forming an extinction ratio error signal;
integrating the extinction ratio error signal with a plurality of previous extinction ratio error signals to form an integrated extinction ratio error signal; and
adjusting the modulation current by providing a selected current path for the modulator, the selected current path corresponding to the integrated extinction ratio error signal.

19. The integrated circuit of claim 17, wherein the extinction ratio controller is further capable of:
sampling the first photodetector current level to form a plurality of first photodetector current indicators;
sampling the second photodetector current level to form a plurality of second photodetector current indicators;
determining a measured extinction ratio as a ratio of a first arithmetic mean of the plurality of first photodetector current indicators to a second arithmetic mean of the plurality of second photodetector current indicators;
determining a variance between the measured extinction ratio and the predetermined extinction ratio, and based on the variance, forming an extinction ratio error signal;
integrating the extinction ratio error signal with a plurality of previous extinction ratio error signals to form an integrated extinction ratio error signal; and adjusting the modulation current by providing a selected current path for the modulator, the selected current path corresponding to the integrated extinction ratio error signal.

20. A method of controlling an optical midpoint power level of a semiconductor laser, the method comprising:
(a) modulating the semiconductor laser at a first modulation level when the input data signal has a first logical state and modulating the semiconductor laser at a second modulation level when the input data signal has a second logical state;
(b) transmitting an optical signal having a first optical power level in response to the first modulation level and having a second optical power level in response to the second modulation level, the first optical power level being greater than the second optical power level;
(c) detecting the first optical power level and the second optical power level;
(d) determining a measured optical midpoint power level as an arithmetic mean of the detected first optical power level and the detected second optical power level;
(e) determining an optical midpoint error as a variance between the measured optical midpoint power level and a predetermined optical midpoint power level; and
(f) using the optical midpoint error, adjusting the forward bias current of the semiconductor laser to generate the optical signal having substantially the predetermined optical midpoint power level, wherein using the optical midpoint error further comprises:
integrating the optical midpoint error with a plurality of previous optical midpoint errors to form an integrated optical midpoint error; and
adjusting the forward bias current of the semiconductor laser in response to the integrated optical midpoint error.

21. The method of claim 20, wherein step (f) further comprises:
integrating the optical midpoint error with a plurality of previous optical midpoint errors to form an integrated optical midpoint error; and
adjusting the forward bias current of the semiconductor laser by providing a selected current path for the semiconductor laser, the selected current path corresponding to the integrated optical midpoint error.

22. The method of claim 20, wherein step (c) further comprises:
detecting the first optical power level by sampling a first photodetector current generated by the first optical power level to form a first photodetector current indicator and detecting the second optical power level by sampling a second photodetector current generated by the second optical power level to form a second photodetector current indicator.

23. The method of claim 22, wherein the sampling of the first photodetector current and the second photodetector current is performed by sampling corresponding voltage levels.

24. The method of claim 22, wherein step (d) further comprises:
determining the measured optical midpoint power level as an overall mean of a first arithmetic mean of a plurality of samples of the first photodetector current and a second arithmetic mean of a plurality of samples of the second photodetector current.

25. The method of claim 22, wherein step (d) further comprises:
determining the measured optical midpoint power level as an arithmetic mean of the first photodetector current indicator and the second photodetector current indicator.

26. The method of claim 22, wherein step (c) further comprises:
sampling the first photodetector current level when the input data signal has a predetermined number of consecutive bits having the first logical state and sampling the second photodetector current level when the input data signal has a predetermined number of consecutive bits having the second logical state.

27. The method of claim 22, wherein step (c) further comprises:
sampling the first photodetector current level when the input data signal has the first logical state for a predetermined period of time and sampling the second photodetector current level when the input data signal has the second logical state for the predetermined period of time.

28. The method of claim 20, further comprising:
determining a measured extinction ratio as a ratio of the detected first optical power level to the detected second optical power level;
determining an extinction ratio error as a variance between the measured extinction ratio and a predetermined extinction ratio;
integrating the extinction ratio error with a plurality of previous extinction ratio errors to form an integrated extinction ratio error; and
using the integrated extinction ratio error signal, adjusting the modulation of the semiconductor laser to generate the optical signal having substantially the predetermined extinction ratio.

29. The method of claim 20, further comprising:
determining a measured extinction ratio as a ratio of a first arithmetic mean of a plurality of detected first optical power levels to a second arithmetic mean of a plurality of detected second optical power levels;
determining an extinction ratio error as a variance between the measured extinction ratio and a predetermined extinction ratio;
integrating the extinction ratio error with a plurality of previous extinction ratio errors to form an integrated extinction ratio error; and
using the integrated extinction ratio error signal, adjusting the modulation of the semiconductor laser to generate the optical signal having substantially the predetermined extinction ratio.

30. An apparatus comprising:
a semiconductor laser capable of transmitting an optical signal having a first optical power level in response to a first modulation current level and having a second optical power level in response to a second modulation current level, the first optical power level being greater than the second optical power level;
a modulator coupled to the semiconductor laser, the modulator capable of providing the first modulation current level to the semiconductor laser when the input data signal has a first logical state and providing the second modulation current level to the semiconductor laser when the input data signal has a second logical state, the first modulation current level being greater than the second modulation current level;
a photodetector optically coupled to the semiconductor laser, the photodetector capable of generating a first photodetector current level in response to the first optical power level and a second photodetector current level in response to the second optical power level;
a sampler coupled to the photodetector, the sampler capable of sampling the first photodetector current level to form a first photodetector current indicator and sampling the second photodetector current level to form a second photodetector current indicator, wherein the sampler is further capable of sampling the first photodetector current level to form a plurality of first photodetector current indicators and sampling the second photodetector current level to form a plurality of second photodetector current indicators;
a forward bias current controller coupled to the sampler and to the semiconductor laser, the forward bias current controller capable of determining a measured optical midpoint power level as an arithmetic mean of the first photodetector current indicator and the second photodetector current indicator; determining a first variance between the measured optical midpoint power level and a predetermined optical midpoint power level and, based on the first variance, forming an optical midpoint error signal; and in response to the optical midpoint error signal, further capable of adjusting the forward bias current of the semiconductor laser to generate the optical signal having substantially the predetermined optical midpoint power level, wherein the forward bias current controller is further capable of determining the measured optical midpoint power level as an overall arithmetic mean of a first arithmetic mean of the plurality of first photodetector current indicators and a second arithmetic mean of the plurality of second photodetector current indicators; and
a modulation current controller coupled to the sampler and to the modulator, the modulation current controller capable of determining a measured extinction ratio as a ratio of the first photodetector current indicator to the second photodetector current indicator; determining a second variance between the measured extinction ratio and a predetermined extinction ratio and, based on the second variance, forming an extinction ratio error signal; and in response to the extinction ratio error signal, further capable of adjusting the modulation current provided by the modulator to the semiconductor laser to generate the optical signal having substantially the predetermined extinction ratio, wherein the modulation current controller is further capable of determining the measured extinction ratio as a ratio of a first arithmetic mean of the plurality of first photodetector current indicators to a second arithmetic mean of the plurality of second photodetector current indicators.

* * * * *